(12) United States Patent
Lim et al.

(10) Patent No.: US 12,405,851 B2
(45) Date of Patent: Sep. 2, 2025

(54) ELECTRONIC DEVICES AND METHODS OF OPERATING THE SAME

(71) Applicant: Samsung Electronics Co., Ltd., Suwon-si (KR)

(72) Inventors: Jinsoo Lim, Suwon-si (KR); Changkyu Seol, Suwon-si (KR); Myoungbo Kwak, Suwon-si (KR); Daewook Kim, Suwon-si (KR); Dongjin Park, Suwon-si (KR); Hyoungbae Ahn, Suwon-si (KR); Youngdon Choi, Suwon-si (KR); Junghwan Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/420,877

(22) Filed: Jan. 24, 2024

(65) Prior Publication Data
US 2025/0036520 A1 Jan. 30, 2025

(30) Foreign Application Priority Data
Jul. 26, 2023 (KR) .................. 10-2023-0097345

(51) Int. Cl.
*G06F 11/10* (2006.01)
*H03M 13/09* (2006.01)
*H03M 13/45* (2006.01)

(52) U.S. Cl.
CPC ......... *G06F 11/1004* (2013.01); *H03M 13/09* (2013.01); *H03M 13/45* (2013.01)

(58) Field of Classification Search
CPC G06F 11/1004; G06F 11/10; H03M 13/2906; H03M 13/09; H03M 13/45
See application file for complete search history.

(56) References Cited

U.S. PATENT DOCUMENTS

| 7,725,800 B2 | 5/2010 | Yang et al. | |
|---|---|---|---|
| 8,407,563 B2 * | 3/2013 | Karabed | G11B 20/18 714/780 |
| 9,020,346 B2 | 4/2015 | Bhoja | |

(Continued)

OTHER PUBLICATIONS

S. Gregori, A. Cabrini, O. Khouri and G. Torelli, "On-chip error correcting techniques for new-generation flash memories," in Proceedings of the IEEE, vol. 91, No. 4, pp. 602-616, Apr. 2003, (Year: 2003).*

*Primary Examiner* — Cynthia Britt
(74) *Attorney, Agent, or Firm* — Wolf, Greenfield & Sacks, P.C.

(57) ABSTRACT

An electronic device may include a reception circuit configured to generate a plurality of reception data bits based on a voltage level of an analog signal received through a link, and to generate a plurality of bit reliability values indicating probabilities of error occurrence of the plurality of reception data bits based on the voltage level of the analog signal, an alignment circuit configured to group the plurality of reception data bits into a plurality of error correction code (ECC) symbols, and to generate a plurality of symbol reliability values indicating probabilities of error occurrence of the plurality of ECC symbols based on the plurality of bit reliability values, and a decoding circuit configured to correct errors of the plurality of ECC symbols based on the plurality of symbol reliability values.

20 Claims, 25 Drawing Sheets

(56) References Cited

U.S. PATENT DOCUMENTS

| | | |
|---|---|---|
| 9,419,651 B2 | 8/2016 | Karabed et al. |
| 10,790,855 B2 | 9/2020 | Freudenberger et al. |
| 10,944,428 B2 | 3/2021 | Motwani et al. |
| 11,108,412 B2 | 8/2021 | Shin et al. |
| 11,115,055 B2 | 9/2021 | Doubchak et al. |
| 11,356,122 B2 | 6/2022 | Smith et al. |
| 2009/0006930 A1* | 1/2009 | Djurdjevic .............. H04L 1/005 714/780 |
| 2009/0006931 A1* | 1/2009 | Djurdjevic ........ H03M 13/2957 714/E11.197 |
| 2021/0351796 A1* | 11/2021 | Fujimori ........... H03M 13/3707 |

* cited by examiner

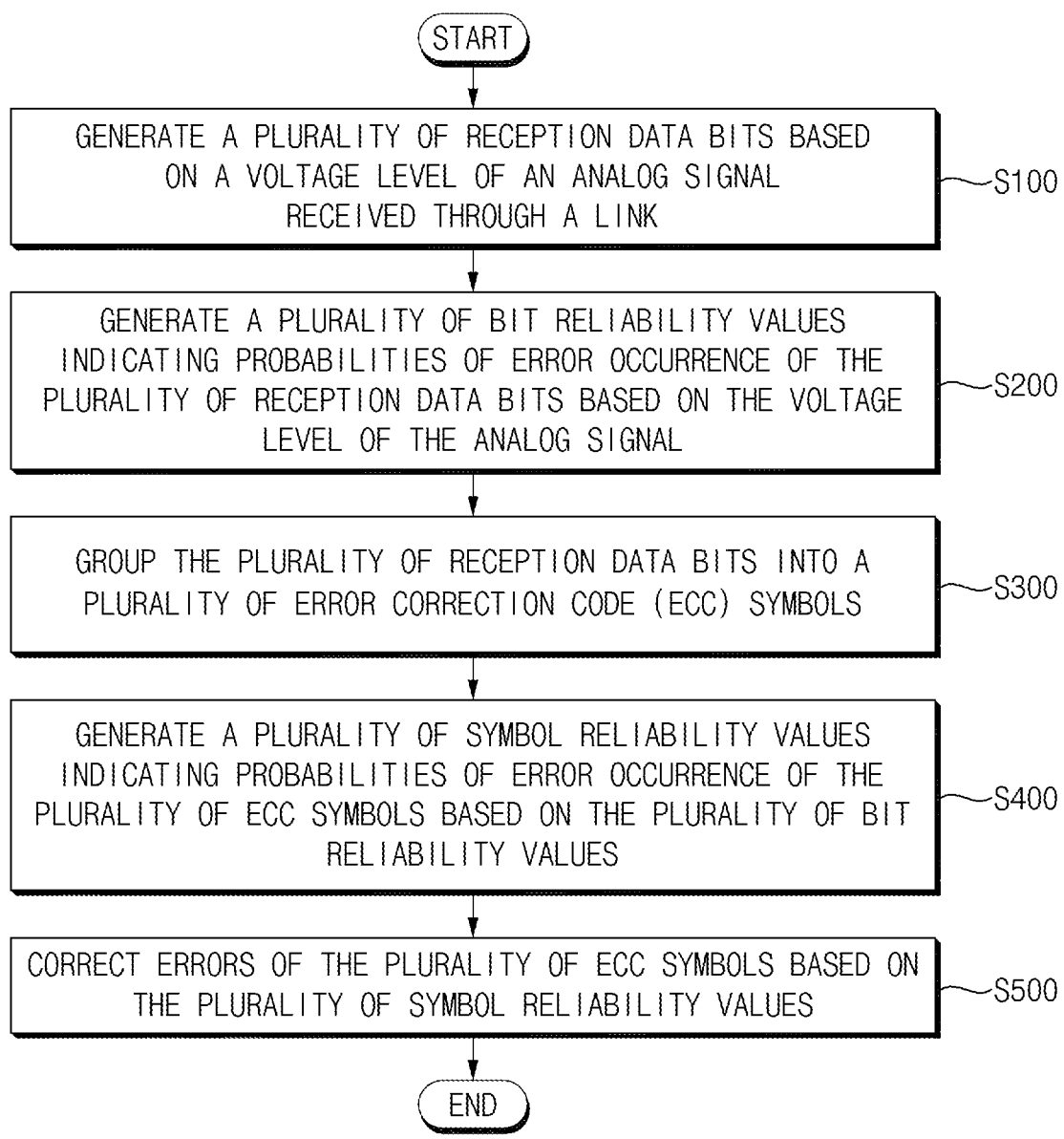

|  | TB ||
|---|---|---|
|  | B11 | B21 |
| VL1 | 0 | 1 |
| VL2 | 1 | 1 |
| VL3 | 1 | 0 |
| VL4 | 0 | 0 |

| HD | RB | SD | BRV |
|---|---|---|---|
| DRS ≥ REF1 | 01 | DRS ≥ HREF1 | 0 |
| | | OTHERWISE | 1 |
| REF2 ≤ DRS<REF1 | 11 | HREF2 ≤ DRS<LREF1 | 0 |
| | | OTHERWISE | 1 |
| REF3 ≤ DRS<REF2 | 10 | HREF3 ≤ DRS<LREF2 | 0 |
| | | OTHERWISE | 1 |
| DRS ≥ REF3 | 00 | DRS<LREF3 | 0 |
| | | OTHERWISE | 1 |

| TIME(UI) | 0 | 1 | 2 | 3 | 4 | ... |
|---|---|---|---|---|---|---|
| RB | 10 | 00 | 11 | 01 | 11 | ... |
| BRV | 0 | 0 | 0 | 1 | 0 | ... |

FIG. 14

| Description | | Lane | | | |
|---|---|---|---|---|---|
| | | 0 | 1 | 2 | 3 |
| 512 UI | TLP Bytes [0···235] | 0 | 1 | 2 | 3 |
| | | 4 | 5 | 6 | 7 |
| | | 8 | 9 | 10 | 11 |
| | | ... | ... | ... | ... |
| | | 224 | 225 | 226 | 227 |
| | | 228 | 229 | 230 | 231 |
| | | 232 | 233 | 234 | 235 |
| | DLP, CRC, ECC Bytes | DLP0 | DLP1 | DLP2 | DLP3 |
| | | DLP4 | DLP5 | CRC0 | CRC1 |
| | | CRC2 | CRC3 | CRC4 | CRC5 |
| | | CRC6 | CRC7 | ECC0A | ECC0B |
| | | ECC0C | ECC1A | ECC1B | ECC1C |

FIG. 15

| UI | 0 | 1 | 2 | 3 | ... | 252 | 253 | 254 | 255 |
|---|---|---|---|---|---|---|---|---|---|
| Lane | S1S0 | S3S2 | S5S4 | S7S6 | | S1S0 | S3S2 | S5S4 | S7S6 |
| | ESM0 | | | | | ESM252 | | | |

FIG. 16A

| ECC symbol | ... | e0 | e1 | e2 | e0 | e1 | e2 | e0 | e1 | e2 | e0 | e1 | ... |
|---|---|---|---|---|---|---|---|---|---|---|---|---|---|
| Index | ... | 41 | 42 | 43 | 44 | 45 | 46 | 47 | 48 | 49 | 50 | 51 | ... |
| Value | ... | 36 | 34 | 86 | 29 | 72 | 66 | 79 | 81 | 44 | 19 | 92 | ... |
| Iteration 1 | ... | 36 | 34 | 86 | 29 | 0 | 66 | 79 | 81 | 44 | 19 | 0 | ... |
| Iteration 2 | ... | 36 | 34 | 86 | 29 | 0 | 66 | 79 | 0 | 44 | 19 | 92 | ... |

Cand1 spans e1, e2, e0 (indices 45, 46, 44)
Cand2 spans e1, e0, e2 (indices 48, 47, 49)
Cand3 spans e1 (index 51)

FIG. 16B

| ECC symbol | ... | Cand1 | | | Cand2 | Cand3 | | | Cand4 | | Cand5 | Cand6 |
|---|---|---|---|---|---|---|---|---|---|---|---|---|
| | ... | e0 | e1 | e2 | e0 | e1 | e2 | e0 | e1 | e2 | e0 | e1 |
| Index | ... | 41 | 42 | 43 | 44 | 45 | 46 | 47 | 48 | 49 | 50 | 51 |
| Value | ... | 36 | 34 | 86 | 29 | 72 | 66 | 79 | 81 | 44 | 19 | 92 |
| Iteration 1 | ... | 0 | 34 | 86 | 0 | 0 | 66 | 79 | 81 | 44 | 0 | 92 |
| Iteration 2 | ... | 0 | 34 | 86 | 0 | 0 | 66 | 79 | 0 | 44 | 19 | 92 |

FIG. 16C

| | Cand1 | | Cand2 | Cand3 | Cand4 | Cand5 | | Cand6 | | Cand7 | Cand8 |
|---|---|---|---|---|---|---|---|---|---|---|---|
| ECC symbol | e0 | e1 | e2 | e0 | e1 | e2 | e0 | e1 | e2 | e0 | e1 |
| Index | 41 | 42 | 43 | 44 | 45 | 46 | 47 | 48 | 49 | 50 | 51 |
| Value | 36 | 34 | 86 | 29 | 72 | 66 | 79 | 81 | 44 | 19 | 92 |
| Iteration 1 | 0 | 34 | 0 | 0 | 0 | 0 | 79 | 81 | 44 | 0 | 92 |
| Iteration 2 | 0 | 34 | 0 | 0 | 0 | 0 | 79 | 0 | 44 | 19 | 92 |

| TIME(UI) | 0 | 1 | 2 | 3 | 4 | 5 | 6 | 7 | ... |
|---|---|---|---|---|---|---|---|---|---|
| RB | S0S1 | S3S2 | S5S4 | S7S6 | S0S1 | S3S2 | S5S4 | S7S6 | |

ESM0 (UI 0–3), ESM1 (UI 4–7)

| BRV | R0 | R1 | R2 | R3 | R0 | R1 | R2 | R3 | ... |
|---|---|---|---|---|---|---|---|---|---|

RSM0 (UI 0–3), RSM1 (UI 4–7)

| SRV | RV0 | RV1 |
|---|---|---|

ELECTRONIC DEVICES AND METHODS OF OPERATING THE SAME

CROSS-REFERENCE TO RELATED APPLICATION

This U.S. non-provisional application claims priority under 35 U.S.C. § 119 to Korean Patent Application No. 10-2023-0097345, filed on Jul. 26, 2023, in the Korean Intellectual Property Office (KIPO), and the entire contents of the above-identified application are incorporated by reference herein.

BACKGROUND

1. Technical Field

Aspects of the present disclosure relate to semiconductor integrated circuits, and more particularly relate to electronic devices and to methods of operating electronic devices having enhanced error correction performance.

2. Discussion of the Related Art

Recently, as transmission speeds between electronic devices have increased, the error occurrence rate of data during the transmission process is increasing. For example, as Peripheral Component Interconnect Express (PCIe) 6.0 adopts Pulse Amplitude Modulation-4 (PAM4), the Bit Error Rate (BER) requirement of the existing Non-Return-to-Zero (NRZ) is changed from 10-12 to 10-6. Accordingly, Error Correction Code (ECC) and Cyclic Redundancy Code (CRC) may be adopted in the physical layer. ECC may be used to correct errors, and a protocol may be adopted to request error detection by CRC and retransmission of data, if errors are not properly corrected or correctable by ECC.

The ECC of PCIe 6.0 includes one symbol consisting of an 8-bit Reed-Solomon (RS) code, and may be configured by concatenating and interleaving three symbols. Since each RS code may only correct one symbol, three errors that occur in succession due to a burst error may be corrected, but there may be a limitation in that two errors that occur in one ECC cannot be corrected.

SUMMARY

Some example embodiments may provide an electronic device and a method of operating an electronic device, capable of enhancing error correction performance by selecting a symbol with a high probability of error occurrence.

According to some embodiments, an electronic device may include a reception circuit configured to generate a plurality of reception data bits based on a voltage level of an analog signal received through a link, and generate a plurality of bit reliability values indicating probabilities of error occurrence of the plurality of reception data bits based on the voltage level of the analog signal, an alignment circuit configured to group the plurality of reception data bits into a plurality of error correction code (ECC) symbols, and generate a plurality of symbol reliability values indicating probabilities of error occurrence of the plurality of ECC symbols based on the plurality of bit reliability values, and a decoding circuit configured to correct errors of the plurality of ECC symbols based on the plurality of symbol reliability values.

According to some embodiments, an electronic device may include a reception circuit configured to generate a plurality of reception data bits based on a voltage level of a pulse amplitude modulation-4 (PAM4) signal received through a link, and to generate a plurality of bit reliability values indicating probabilities of error occurrence of the plurality of reception data bits based on the voltage level of the PAM4 signal, an alignment circuit configured to generate a synchronization location value indicating a location of a data block by monitoring a data pattern included in the plurality of reception data bits where the data block indicates a unit of error correction, to group the plurality of reception data bits into a plurality of error correction code (ECC) symbols based on the synchronization location value, and to generate a plurality of symbol reliability values based on the synchronization location value and the plurality of bit reliability values where the plurality of symbol reliability values indicate probabilities of error occurrence of the plurality of ECC symbols and are aligned to the plurality of ECC symbols, and a decoding circuit configured to correct errors of the plurality of ECC symbols based on the plurality of symbol reliability values.

According to example embodiments, a method of operating an electronic device may include generating a plurality of reception data bits based on a voltage level of an analog signal received through a link, generating a plurality of bit reliability values indicating probabilities of error occurrence of the plurality of reception data bits based on the voltage level of the analog signal, grouping the plurality of reception data bits into a plurality of error correction code (ECC) symbols, generating a plurality of symbol reliability values indicating probabilities of error occurrence of the plurality of ECC symbols based on the plurality of bit reliability values and correcting errors of the plurality of ECC symbols based on the plurality of symbol reliability values.

The electronic device and the method of operating the electronic device according to example embodiments may efficiently extract the error symbol candidates and enhance the error correction performance by generating the symbol reliability values with respect to the ECC symbols based on the voltage level of the analog signal received through the link.

BRIEF DESCRIPTION OF THE DRAWINGS

Example embodiments of the present disclosure will be more clearly understood from the following detailed description taken in conjunction with the accompanying drawings.

FIG. 2 is a flowchart illustrating a method of operating an electronic device according to some embodiments.

FIG. 14 is a diagram for describing a flit mode supported by a logical sub block.

FIG. 15 is a diagram illustrating an error correction code (ECC) symbol for each lane.

FIGS. 16A, 16B and 16C are diagrams for describing erasure decoding according to some embodiments.

DETAILED DESCRIPTION OF THE EMBODIMENTS

Figure 1:
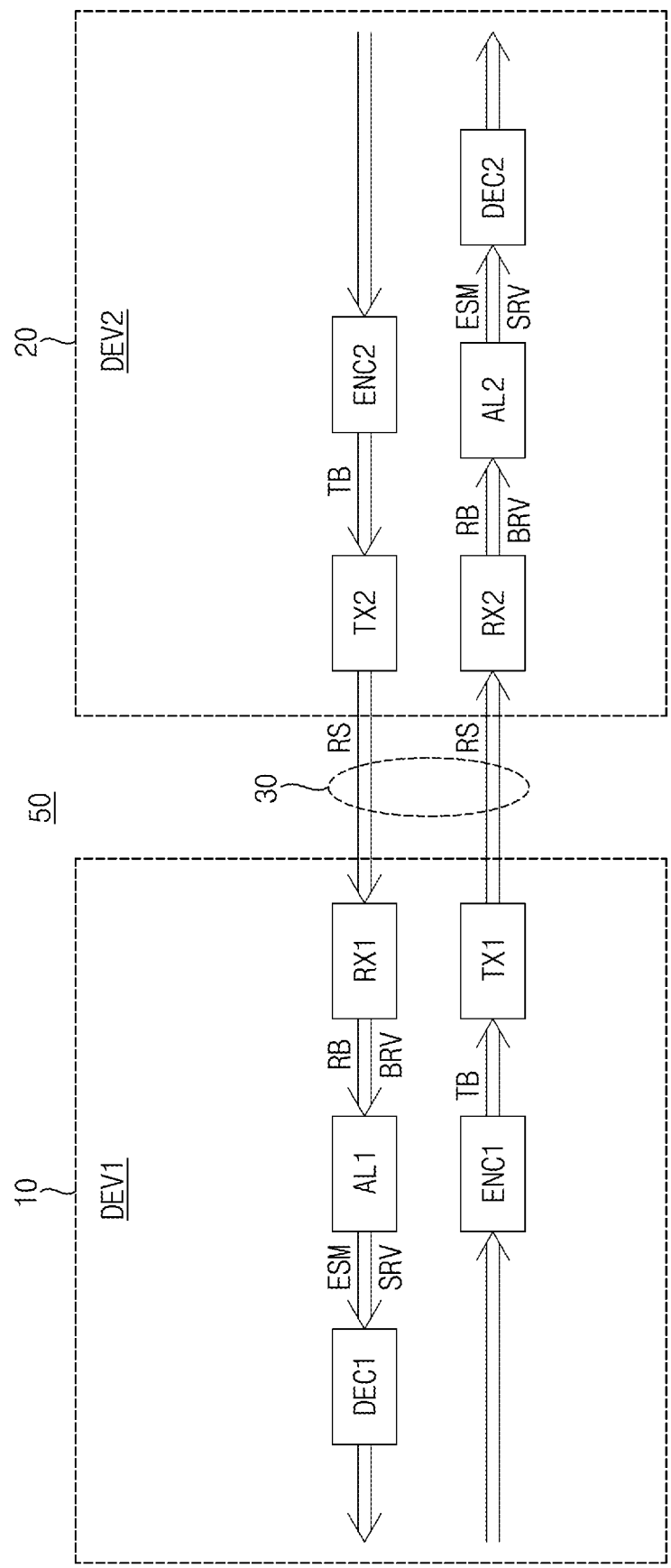
FIG. 1 is a block diagram illustrating a system according to some embodiments.

Various examples of embodiments will be described more fully hereinafter with reference to the accompanying drawings, in which some embodiments are shown. In the drawings, like numerals refer to like elements throughout, and repeated descriptions of some elements may be omitted herein in the interest of brevity.

FIG. 1 is a block diagram illustrating a system according to some embodiments.

Referring to FIG. 1, a system 50 may include a first electronic device (DEV1) 10 and a second electronic device (DEV2) 20 connected through a link 30. FIG. 1 shows only some components for explanation of some embodiments.

The first electronic device 10 and the second electronic device 20 may further include various components depending on their respective configurations.

The first electronic device 10 may include a first reception circuit RX1, a first alignment circuit AL1, a first decoding circuit DEC1, a first transmission circuit TX1 and a first encoding circuit ENC1.

The first reception circuit RX1, the first alignment circuit AL1, and the first decoding circuit DEC1 may correspond to a reception block that receives analog signals RS transmitted from the second electronic device 20 through the link 30. The first transmission circuit TX1 and the first encoding circuit ENC1 may correspond to a transmission block that transmits analog signals RS to the second electronic device 20 through the link 30.

The second device 20 may include a second reception circuit RX2, a second alignment circuit AL2, a second decoding circuit DEC2, a second transmission circuit TX2, and a second encoding circuit ENC2.

The second reception circuit RX2, the second alignment circuit AL2, and the second decoding circuit DEC2 may correspond to a reception block that receives analog signals RS transmitted from the first electronic device 10 through the link 30. The second transmission circuit TX2 and the second encoding circuit ENC2 may correspond to a transmission block that transmits analog signals RS to the first electronic device 10 through the link 30.

In some example embodiments, the first electronic device 10 and the second electronic device 20 may be connected through a Peripheral Component Interconnect Express (PCIe) link 30 conforming to the PCIe standards. However, the present disclosure and the inventive concepts thereof are not limited to a specific link, and may be applied to any link that transmits data and/or signals through multi-level signaling.

In FIG. 1, the first electronic device 10 and the second electronic device 20 may be connected through the two-way link 30, and each electronic device 10 and 20 may include a reception block and a transmission block, which may function as a transceiver used to exchange analog signals RS between the first electronic device 10 and the second electronic device 20.

When packets are transferred from the second electronic device 20 to the first electronic device 10, the first electronic device 10 corresponds to a receiving device and the second electronic device 20 corresponds to a transmitting device. Conversely, when packets are transmitted from the first electronic device 10 to the second electronic device 20, the first electronic device 10 corresponds to a transmitting device and the second electronic device 20 corresponds to a receiving device.

According to some embodiments, the first electronic device 10 and the second electronic device 20 may be connected through a unidirectional link. In this case, one of the first electronic device 10 and the second electronic device 20 may correspond to a transmitting device and may include only a transmission block, and the other may correspond to a receiving device and may include only a reception block.

Hereinafter, some embodiments will be described focusing on the relationship between one receiving device and one transmitting device. However, as shown in FIG. 1, it will be understood that description provided herein may be applied in the same way where the first electronic device 10 and the second electronic device 20 are implemented as transmitting and receiving devices configured to perform two-way communication.

FIG. 2 is a flowchart illustrating a method of operating an electronic device according to some embodiments.

Referring to FIGS. 1 and 2, the reception circuit RX1 or RX2 included in the receiving device may generate a plurality of reception data bits RB based on a voltage level of an analog signal RS received through the link 30 (S100). In addition, the reception circuit RX1 or RX2 may generate a plurality of bit reliability values BRV indicating probabilities of error occurrence of the plurality of reception data bits RB based on the voltage level of the analog signal RS (S200). Some embodiments of the reception circuit RX1 and RX2 will be described below with reference to FIGS. 6, 7, 8, 26, etc.

The alignment circuit AL1 or AL2 of the receiving device may group the plurality of reception data bits RB into a plurality of error correction code (ECC) symbols ESM (S300). In addition, the alignment circuit AL1 or AL2 of the receiving device may generate a plurality of symbol reliability values SRV representing probabilities of error occurrence of the plurality of ECC symbols ESM based on the plurality of bit reliability values BRV (S400). Some embodiments of the alignment circuit AL1 and AL2 will be described below with reference to FIG. 19, etc.

The decoding circuit DEC1 or DEC2 of the receiving device may correct errors of the plurality of ECC symbols ESM based on the plurality of symbol reliability values SRV (S500). Some embodiments of the decoding circuit DEC1 and DEC2 will be described below with reference to FIG. 13, etc.

The encoding circuit ENC1 or ENC2 of the transmitting device may encode data and generate transmission bits TB. The transmission circuit TX1 and TX2 of the transmitting device may transmit the analog signal RS corresponding to a multi-level signal to the receiving device through the link 30 based on the transmission bits TB.

When error correction of the decoding circuit DEC1 and DEC2 fails, the plurality of bit reliability values BRV and/or the plurality of symbol reliability values (SRV) may be recalculated based on previous decoding results, etc. In this case, signal latency may increase due to the error correction.

On the other hand, according to some embodiments, the plurality of ECC symbols ESM and the plurality of symbol reliability values SRV aligned to the plurality of ECC symbols ESM may be provided simultaneously to the decoding circuit DEC1 or DEC2, regardless of success or failure of error correction of the decoding circuit DEC1 or DEC2. Accordingly, the performance of the electronic device may be improved by reducing the error correction time of the decoding circuits DEC1 and DEC2 and increasing the success probability of the error correction.

FIGS. 3A, 3B, 3C and 3D are diagrams for describing signal transfer of the system of FIG. 1.

Figure 3A:
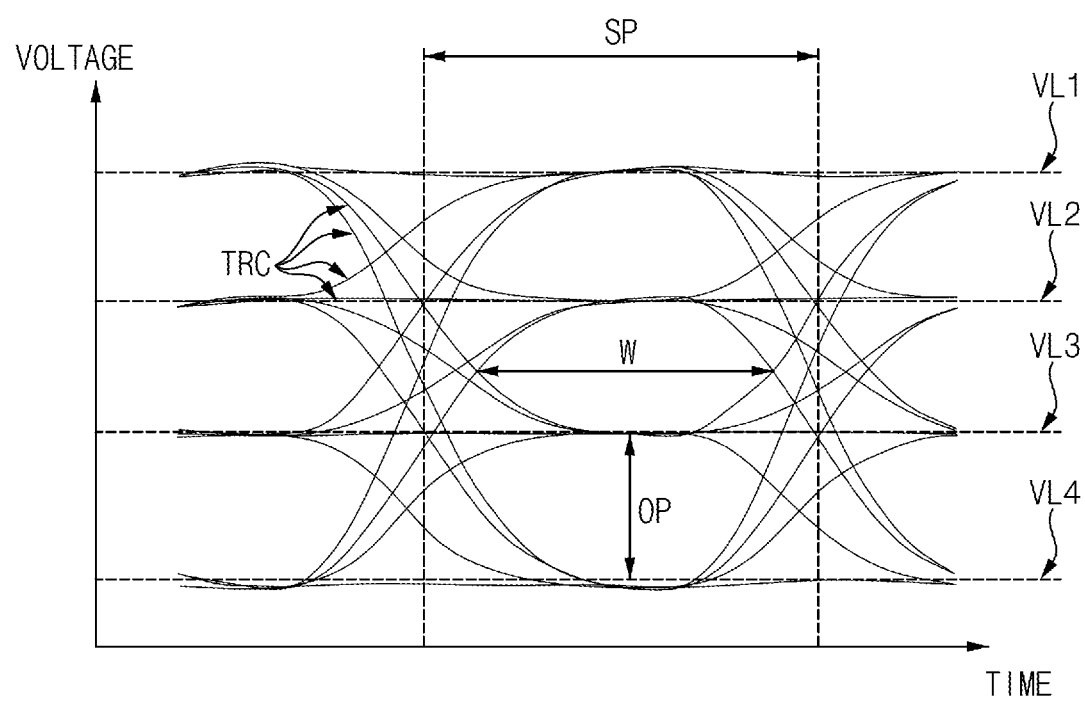
FIGS. 3A, 3B, 3C and 3D are diagrams for describing signal transfer of the system of FIG. 1.
Figure 3B:
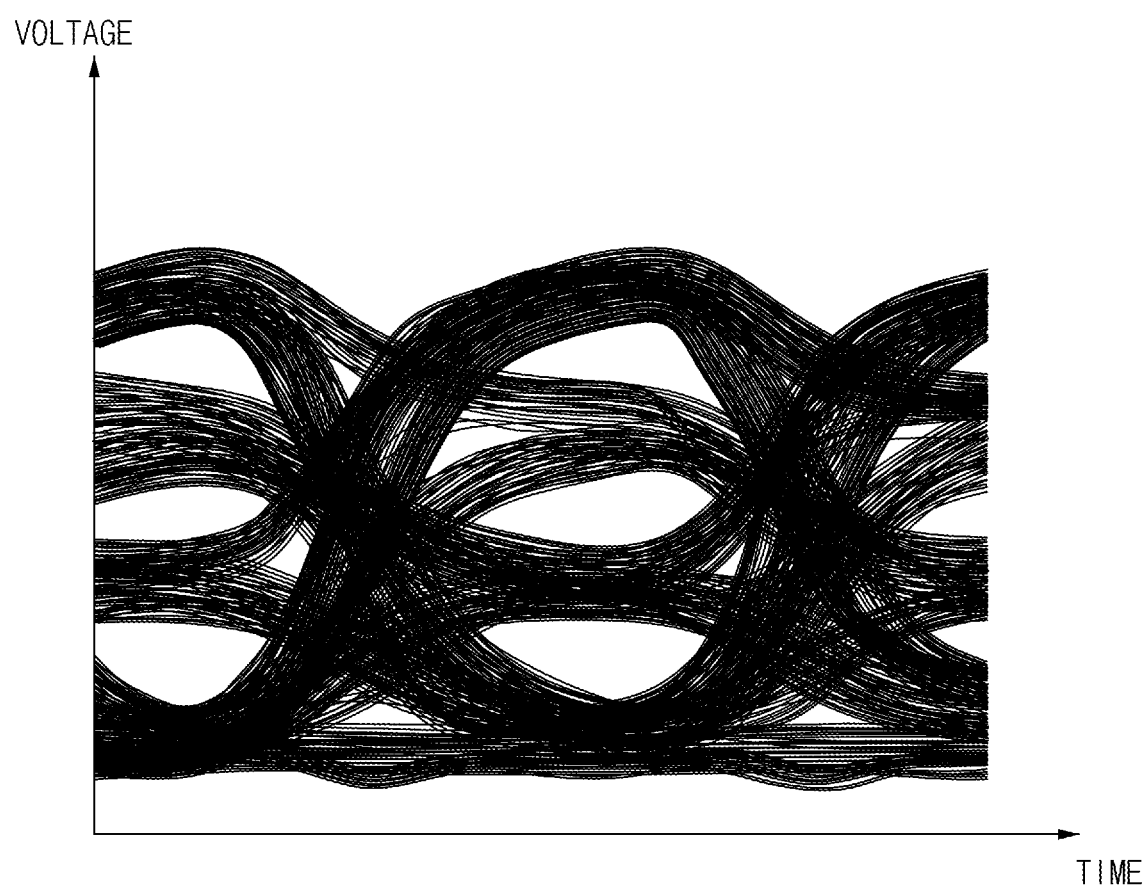
Figures 3C, 3D:
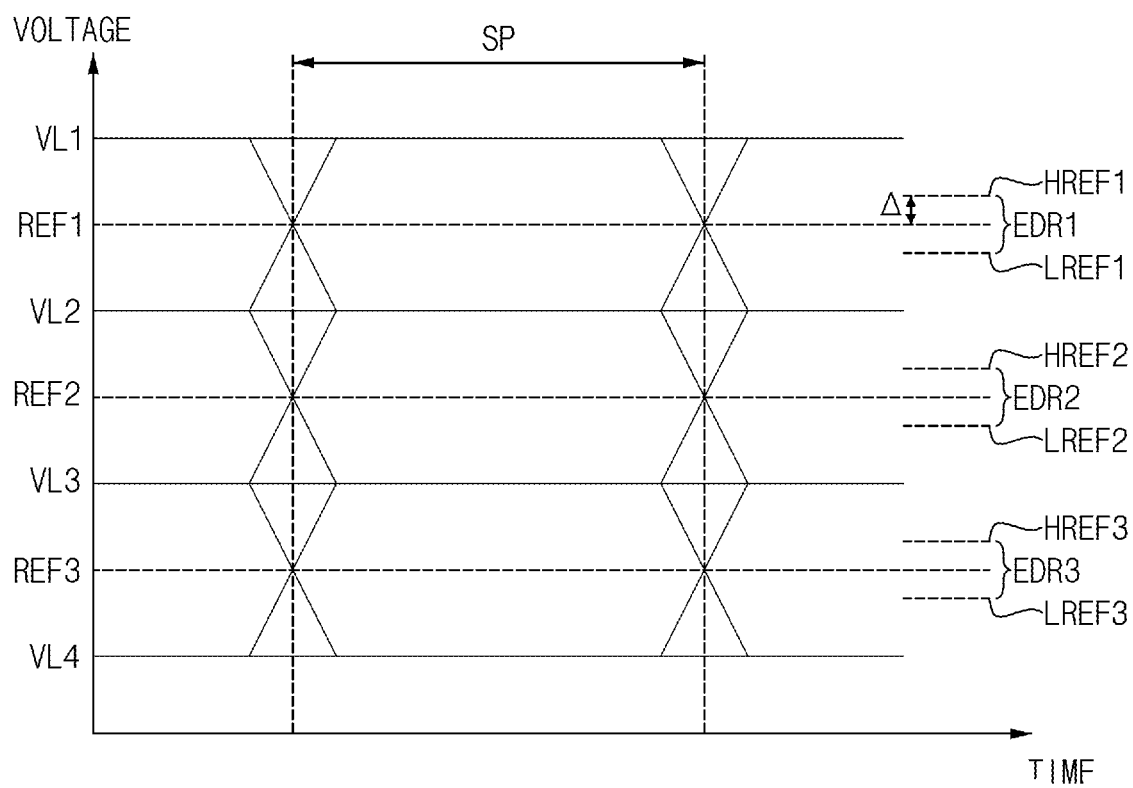

FIG. 3A shows an ideal eye diagram for the analog signal RS of FIG. 1, FIG. 3B shows an eye diagram obtained by actually simulating the analog signal RS, and FIG. 3C shows a schematic eye diagram of FIG. 3A. FIG. 3D shows an example configuration of the transmission bits TB represented by the analog signal RS.

Referring to FIGS. 3A and 3B, eye diagrams may be used to indicate signal quality in high-speed transmission. For example, the eye diagram may represent the analog signal RS, such as a PAM4 signal, used to communicate data in a system (e.g., the system 50 in FIG. 1). For example, an eye diagram may represent four symbols of a signal (e.g., '00', '10', '11', '01'), where each of the four symbols represents different voltage levels (or voltage amplitudes) VL1, VL2, VL3 and VL4. Eye diagrams may be used to provide a visual representation of signal integrity and may indicate the noise margin of a signal.

To generate an eye diagram, an oscilloscope or other computing device may sample a digital signal according to a sample period SP (e.g., unit time interval or bit period). The sample period SP may be defined by a clock associated with transmission of the signal. The oscilloscope or other computing device may measure the voltage level of the signal during the sample period SP to form traces (TRC). By overlapping a plurality of traces TRC, various characteristics of the measured signal may be determined.

Eye diagrams may be used to identify a number of characteristics of communication signals, such as jitter, crosstalk, electromagnetic interference (EMI), signal loss, signal-to-noise ratio (SNR), and other characteristics. For example, an eye width W may be used to indicate timing synchronization of the measured signal or jitter effects in the measured signal. An eye opening OP may represent the peak-to-peak voltage difference between various voltage levels VL1, VL2, VL3 and VL4, and may be associated with a voltage margin to distinguish between the voltage levels VL1, VL2, VL3 and VL4 of the measured signal.

FIG. 3C illustrates first, second, third and fourth voltage levels VL1, VL2, VL3 and VL4 of the PAM4 type analog signal RS and first, second and third hard decision reference values REF1, REF2 and REF3 for detecting or sensing the different voltage levels VL1, VL2, VL3 and VL4. In some example embodiments, the reception circuit RX1 or RX2 may sample digitally the analog signal RS by converting the voltage level of the analog signal RS into the reception digital value using an analog-to-digital converter and comparing the reception digital value with first, second, and third hard decision reference values REF1, REF2 and REF3. In some example embodiments, the reception circuit or and RX2 may sample the analog signal RS using an analog method that directly compares the analog signal RS with first, second and third reference voltage levels.

The first voltage level VL1 is higher than the second voltage level VL2, the second voltage level VL2 is higher than the third voltage level VL3, and the third voltage level VL3 is higher than the fourth voltage level VL4. For example, the first voltage level VL1 may be the same as the level of a power supply voltage VDDQ, the second voltage level VL2 may be about ⅔ of the level of the power supply voltage VDDQ, the third voltage level VL3 may be about ⅓ of the level of the power supply voltage VDDQ, and the fourth voltage level VL4 may be the level of a ground voltage GND (i.e., approximately 0V).

The first hard decision reference value REF1 may correspond to a voltage level between the first voltage level VL1 and the second voltage level VL2, the second hard decision reference value REF2 may correspond to a voltage level between the second voltage level VL2 and the third voltage level VL3, and the third hard decision reference value REF3 may correspond to a voltage level between the third voltage level VL3 and the fourth voltage level VL4. For example, the first hard decision reference value REF1 may correspond to about ¾ of the level of the power supply voltage VDDQ, the second hard decision reference value REF2 may correspond to about ½ of the level of the power supply voltage VDDQ, and the third hard decision reference value REF3 may correspond to about ¼ of the level of the power supply voltage VDDQ.

FIG. 3D shows illustrates the relationship between the first, second, third and fourth voltage levels VL1, VL2, VL3 and VLA of the PAM4 analog signal RS and the transmission bits TB, that is, the values of the first and second bits B11 and B21 corresponding to one PAM4 symbol.

When the transmission bits TB corresponding to one PAM4 symbol have the value of '01', that is, the value of the first bit B11 is '0' and the value of the second bit B21 is '1', the analog signal RS generated based on the transmission bits TB may have the first voltage level VL1. Similarly, the analog signal RS may have the second voltage level VL2 when the transmission bits TB have a value of '11', the analog signal RS may have the third voltage level VL3 when the transmission bits TB have a value of '10', and the analog signal RS may have the fourth voltage level VL4 when the transmission bits (TB) have a value of '00'.

In the embodiment of FIG. 3D, the first bit B11 may be the most significant bit MSB of the transmission bits TB corresponding to one PAM4 symbol, and the second bit B21 may be the least significant bit LSB of the transmission bits TB. However, the present disclosure is not limited thereto.

In addition, according to some embodiments, the reception digital value may be compared with a plurality of soft decision reference values representing a plurality of error decision ranges centered on the plurality of hard decision reference values, respectively, to generate the plurality of bit reliability values BRV.

For example, as shown in FIG. 3C, the first error decision range EDR1 may be centered on the first hard decision reference value REF1, and may be represented by a first upper soft decision reference value HREF1 and a first lower soft decision reference value LREF1. The second error decision range EDR2 may be centered on the second hard decision reference value REF2, and may be represented by a second upper soft decision reference value HREF2 and a second lower soft decision value LREF2. The third error decision range EDR3 may be centered on a third hard decision reference value REF3, and may be represented by a third upper soft decision reference value HREF3 and a third lower soft decision reference value LREF3.

The upper soft decision reference values HREFi (i=1, 2, 3) may be greater than the corresponding hard decision reference value REFi by a threshold value Δ, and the lower soft decision reference values LREFi may be smaller than the corresponding hard decision reference value REFi by the threshold value Δ. In other words, each error decision range EDRi may be twice the threshold value Δ (that is, 2*Δ).

Figures 4, 5:
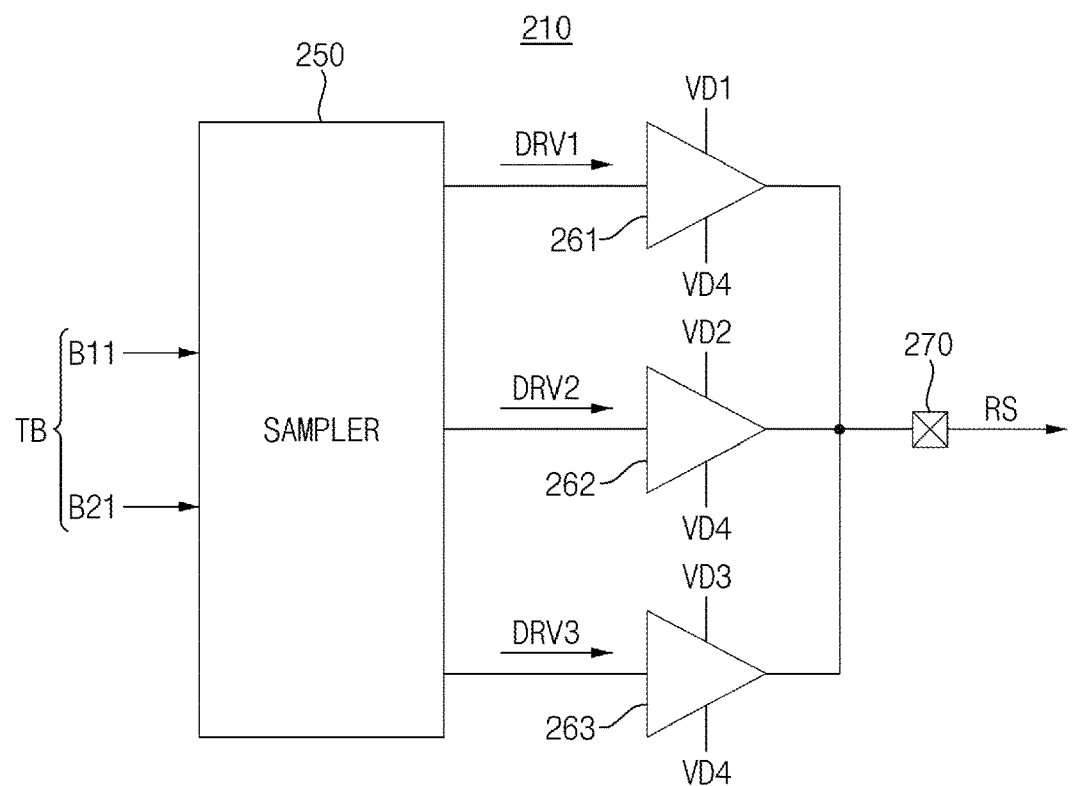
FIG. 4 is a diagram illustrating some embodiments of hard decision and soft decision of an electronic device according to some embodiments.
FIG. 5 is a block diagram illustrating an example of a transmission circuit included in an electronic device according to some embodiments.

FIG. 4 is a diagram illustrating example embodiments of hard decision and soft decision of an electronic device according to some embodiments.

Referring to FIG. 4, the hard decision (HD) may be performed to determine the value of the reception data bits RB by comparing the reception digital value DRS corresponding to a voltage level of the analog signal RS with the hard decision reference values REF1, REF2 and REF3. In addition, the soft decision (SD) may be performed to determine bit reliability values VRV by comparing the reception digital value DRS with soft decision reference values HREF1, HREF2, HREF3, LREF1, LREF2 and LREF3.

As a result, as shown in FIG. 4, when the reception digital value DRS is included in the plurality of error decision ranges EDR1, EDR2 and EDR3, each bit reliability value BRV may be determined as a first value (e.g., '1') indicating that the probability of error occurrence is relatively high. On the other hand, when the reception digital value DRS is not included in the plurality of error determination ranges EDR1, EDR2 and EDR3, each bit reliability value BRV may be determined as a second value (e.g., '0') indicating that the probability of error occurrence is relatively low.

FIG. 5 is a block diagram illustrating an example embodiment of a transmission circuit included in an electronic device according to example embodiments.

Referring to FIG. 5, a transmission circuit 210 may generate an analog signal RS having one of the first, second, third and fourth voltage levels VL1, VL2, VL3, and VL4 based on a value of a first bit B11 and a value of a second bit B21 included in transmission bits TB corresponding to one PAM4 symbol.

The transmission circuit 210 may include a sampler 250, a first driver 261, a second driver 262, a third driver 263, and a data input-output pad 270.

The sampler 250 may be configured to generate a first driving signal DRV1, a second driving signal DRV2, and a third driving signal DRV3 based on the value of the first bit B11 and the value of the second bit B21.

The first driver 261 may be configured to generate the analog signal RS having the first voltage level VL1 or the fourth voltage level VL4 based on the first driving signal DRV1. The second driver 262 may generate the analog signal RS having the second voltage level VL2 or the fourth voltage level VL4 based on the second driving signal DRV2. The third driver 263 may generate the analog signal RS having the third voltage level VL3 or a the fourth voltage level VL4 based on the third driving signal DRV3.

In some example embodiments, each of the first, second and third drivers 261, 262 and 263 may include a complementary metal-oxide semiconductor (CMOS) gate. For example, the first driver 261 may include a CMOS gate that operates based on the first driving voltage VD1 having the first voltage level VL1 and the fourth driving voltage VD4 having the fourth voltage level VL4, the second driver 262 may include a CMOS gate that operates based on the second driving voltage VD2 having the second voltage level VL2 and the fourth driving voltage VD4, and the third driver 263 may include a CMOS gate that operates based on the third driving voltage VD3 having the third voltage level VL3 and the fourth driving voltage VD4.

When the transmission bits TB have a value of '01', the first driving signal DRV1 may have a logic high level, and the first driver 261 may be configured to generate the analog signal RS having the first voltage level VL1 based on the first driving signal DRV1, and at this time, the second and third drivers 262 and 263 may be deactivated. Similarly, when the transmission bits TB have a value of '11', the second driving signal DRV2 may have a logic high level, and the second driver 262 may be configured to generate the analog signal RA having the second voltage level VL2 based on the second driving signal DRV2, and at this time, the first and third drivers 261 and 263 may be deactivated. When the transmission bits TB have a value of '10', the third driving signal DRV3 may have a logic high level, and the third driver 263 may be configured to generate the analog signal RS having the third voltage level VL3 based on the third driving signal DRV3, and at this time, the first and second drivers 261 and 262 may be deactivated.

Meanwhile, when the transmission bits TB have a value of '00', at least one of the first, second, and third driving signals DRV1, DRV2 and DRV3 may have a logic low level, and at least one of the first, second and third drivers 261, 262 and 263 may be configured to generate the analog signal RS having the fourth voltage level VL4 based on at least one of the first, second and third driving signals DRV1, DRV2 and DRV3.

The data input-output pad 270 may output the analog signal RS through a link. For example, the pad may indicate a contact pad or a contact pin, but the present disclosure is not limited thereto.

Figure 6:
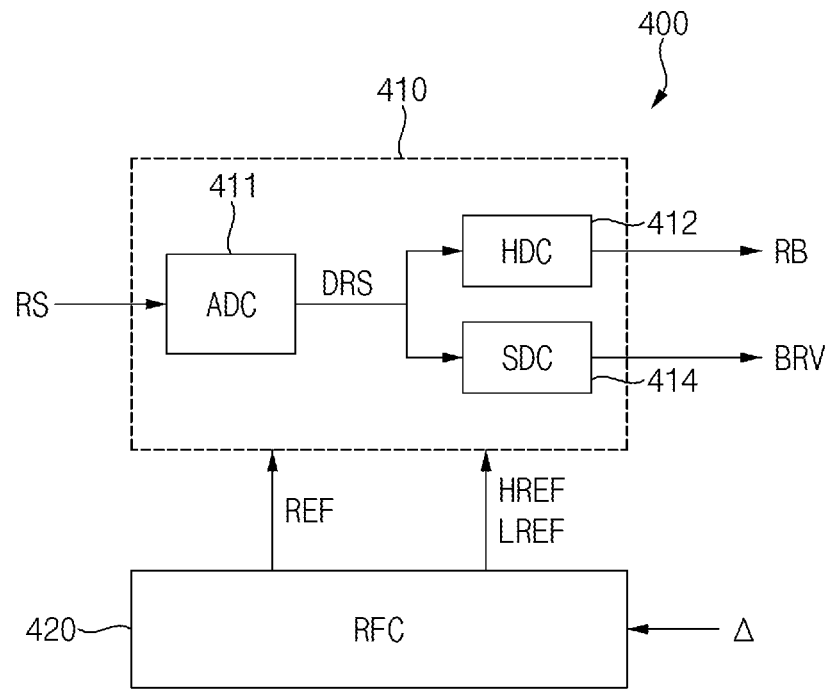
FIG. 6 is a block diagram illustrating an example of a reception circuit included in an electronic device according to some embodiments.

FIG. 6 is a block diagram illustrating an example of a reception circuit included in an electronic device according to some embodiments.

Referring to FIG. 6, a reception circuit 400 may include a sampler 410 and a reference value generator (RFC) 420.

The reference value generator 420 may be configured to generate hard decision reference values HREF and soft decision reference values HREF and LREF as described above with reference to FIGS. 3C and 4. In some embodiments, the reference value generator 420 may adjust the above-described error decision ranges EDR1, EDR2 and EDR3 based on a threshold value Δ. In other words, the reference value generator 420 may adjust the soft decision reference values HREF and LREF based on the threshold value Δ. A method of adjusting the width of such an error decision range will be described below with reference to FIG. 13.

The sampler 410 may include an analog-to-digital converter (ADC) 411, a hard decision circuit (HDC) 412, and a soft decision circuit (SDC) 414.

The analog-to-digital converter 411 may be configured to convert the voltage level of the analog signal RS into the reception digital value DRS. The hard decision circuit 412 may generate the plurality of reception data bits RB by comparing the reception digital value DRS with the plurality of hard decision reference values REF. The soft decision circuit 414 may generate the plurality of bit reliability values BRV by comparing the reception digital value DRS with the plurality of soft decision reference values HREF and LREF indicating the plurality of error decision ranges EDR, each error decision range EDR centered around a respective one of the plurality of hard decision reference values REF.

Figure 7:
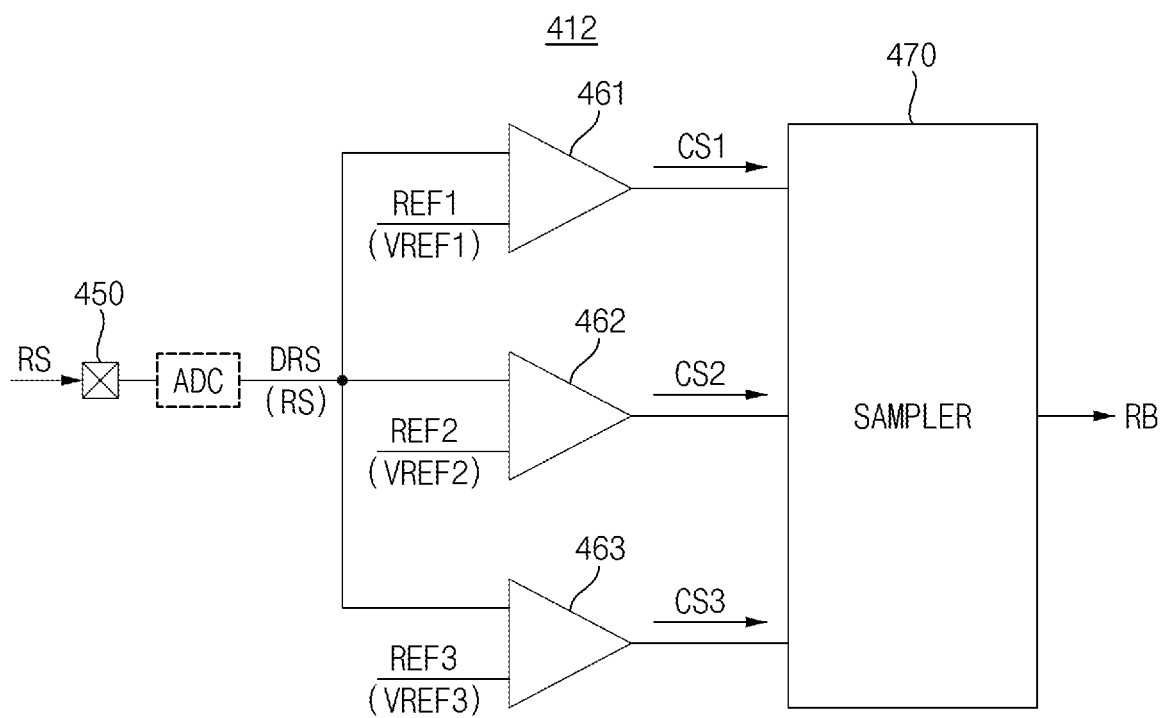
FIG. 7 is a block diagram illustrating an example embodiment of a hard decision circuit included in the reception circuit of FIG. 6.

FIG. 7 is a block diagram illustrating an example of a hard decision circuit included in the reception circuit of FIG. 6.

Referring to FIG. 7, a hard decision circuit 412 may be configured to generate the plurality of reception data bits RB by comparing the reception digital value DRS with the plurality of hard decision reference values REF1, REF2 and REF3. FIG. 7 illustrates an analog-to-digital converter ADC that is configured to convert the analog signal RS received through the input-output pad 450 into the reception digital value DRS. When an analog sampling method is adopted, the analog-to-digital converter ADC may be omitted. In this case, the hard decision circuit 412 may be configured to generate the plurality of reception data bits RB by comparing the voltage level of the analog signal RS with the plurality of hard decision reference voltages VREF1, VREF2 and VREF3.

The hard decision circuit 412 may include a first comparator 461, a second comparator 462, a third comparator 463 and a sampler 470.

The first comparator 461 may generate a first comparison signal CS1 based on a comparison of the reception digital value DRS with the first hard decision reference value REF1. The second comparator 462 may generate a second comparison signal CS2 based on a comparison of the reception digital value DRS with the second hard decision reference value REF2. The third comparator 463 may generate a third comparison signal CS3 based on a comparison of the reception digital value DRS with the third hard decision reference value REF3.

In the case of the analog sampling method, each of the first, second and third comparators 461, 462 and 463 may include an operational amplifier. For example, the first comparator 461 may include an operational amplifier that operates based on the analog signal (RS) and the first hard decision reference voltage VREF1, the second comparator 462 may include an operational amplifier that operates based on the analog signal RS and the second hard decision reference voltage VREF2, and the third comparator 463 may include an operational amplifier that operates based on the analog signal RS and the third hard decision reference voltage VREF3.

The sampler 470 may be configured to generate the reception data bits RB based on the first, second and third comparison signals CS1, CS2 and CS3. As a result, the hard decision circuit 412 may perform the hard decision (HD) as described with reference to FIG. 4.

Figure 8:
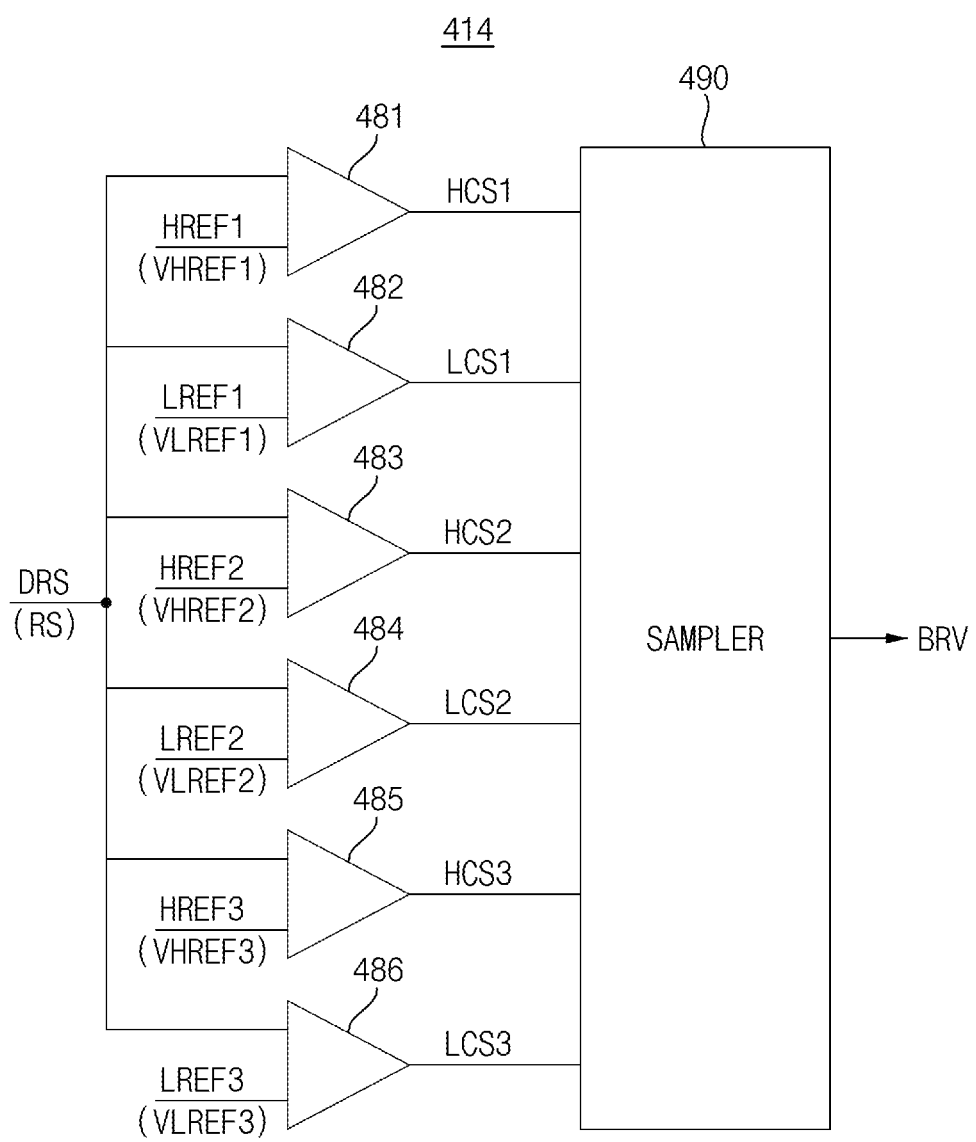
FIG. 8 is a block diagram illustrating an example embodiment of a soft decision circuit included in the reception circuit of FIG. 6.

FIG. 8 is a block diagram illustrating an example of a soft decision circuit included in the reception circuit of FIG. 6.

Referring to FIG. 8, a soft decision circuit 414 may be configured to generate the plurality of bit reliability values BRV by comparing the reception digital value DRS with the plurality of soft decision reference values HREF1, LREF1, HREF2, LREF2, HREF3 and LREF3. When the analog sampling method is adopted, the analog-to-digital converter ADC described above may be omitted. In this case, the soft decision unit 414 may be configured to generate the plurality of reception data bits RB by comparing the voltage level of the analog signal RS with the plurality of soft decision reference voltages VHREF1, VLREF1, VHREF2, VLREF2, VHREF3 and VLREF3, respectively.

The hard decision circuit 412 may include a first comparator 481, a second comparator 482, a third comparator 483, a fourth comparator 484, a fifth comparator 485, a sixth comparator 486 and a sampler 490.

The first comparator 481 may generate a first upper comparison signal HCS1 based on a comparison of the reception digital value DRS with a first upper soft decision reference value HREF1. The second comparator 482 may generate a first lower comparison signal LCS1 based on a comparison of the reception digital value DRS with a first lower soft decision reference value LREF1. The third comparator 483 may generate a second upper comparison signal HCS2 based on a comparison of the reception digital value DRS with a second upper soft decision reference value HREF2. The fourth comparator 484 may generate a second lower comparison signal LCS2 based on a comparison of the reception digital value DRS with a second lower soft decision reference value LREF2. The fifth comparator 485 may generate a third higher comparison signal HCS3 based on a comparison of the reception digital value DRS with a third higher soft decision reference value HREF3. The sixth comparator 486 may generate a third lower comparison signal LCS3 based on a comparison of the reception digital value DRS with a third lower soft decision reference value LREF3.

The sampler 490 may be configured to generate the bit reliability values based on the first, second and third upper comparison signals HCS1, HCS2 and HCS3 and the first, second and third lower comparison signals (LCS1, LCS2, LCS3). As a result, the soft decision circuit 414 may be configured to perform the soft decision (SD) as described with reference to FIG. 4.

Figures 9, 10:
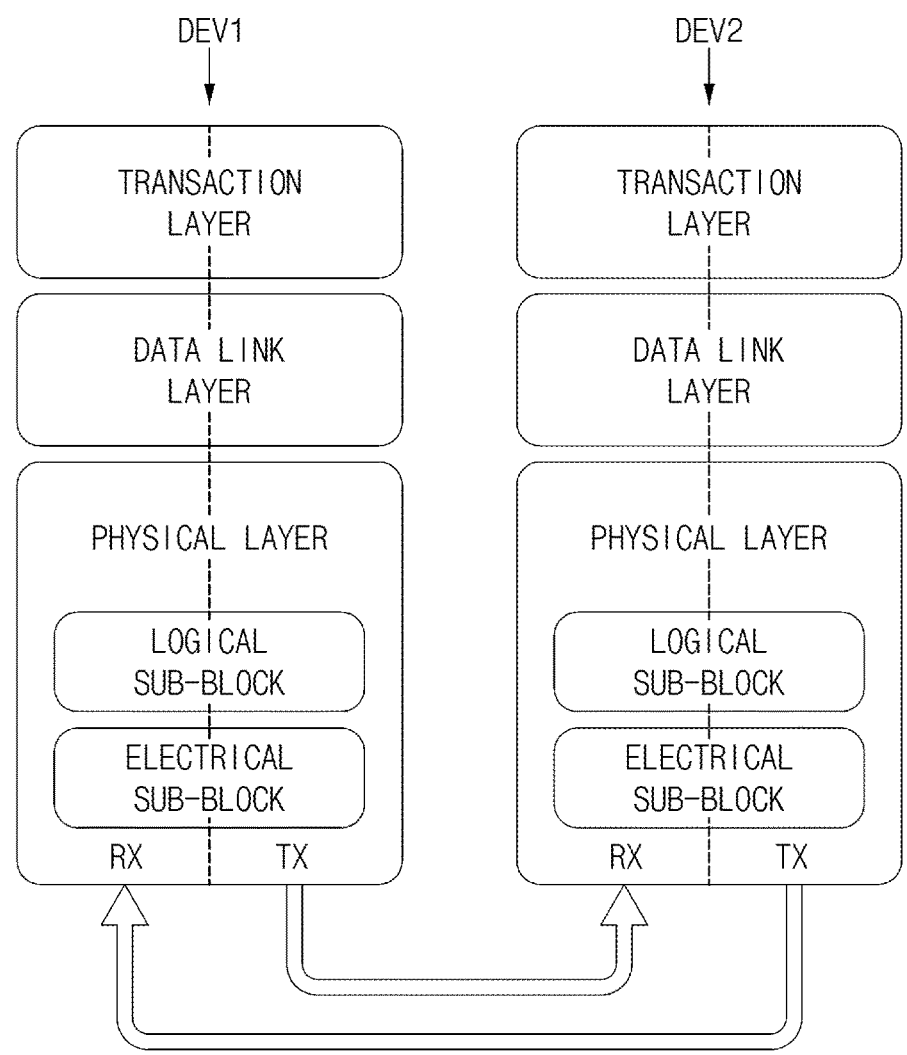
FIG. 9 is a diagram illustrating an example of reception data bits output from a reception circuit included in an electronic device according to some embodiments, and corresponding bit reliability values.
FIGS. 10 and 11 are diagrams illustrating an example embodiment of an interconnect architecture applied to a system according to some embodiments.

FIG. 9 is a diagram illustrating an example of reception data bits output from a reception circuit included in an electronic device according to some embodiments, and corresponding bit reliability values.

In FIG. 9, a unit interval UI represents a time interval corresponding to one PAM3 symbol received by the receiving device. As shown in FIG. 9, the reception circuit may output the plurality of reception data bits RB and the plurality of corresponding reliability values BRV in an aligned state.

Hereinafter, some embodiments will be described based on the Peripheral Component Interconnect Express (PCIe) architecture among multiple interconnect fabric architectures. The primary goal of PCIe is to enable components and devices from different vendors to meet multiple market segments; PCIe allows them to inter-operate in an open architecture spanning clients (desktops and mobile), servers (standard and enterprise), and embedded and communications devices. PCIe is a high-performance, general-purpose I/O interconnect defined for a wide variety of future computing and communications platforms. Some PCIe properties, such as a usage model, load-store architecture, and software interfaces thereof, have been maintained across its revisions, while previous parallel bus implementations have been replaced with fully serial interface having a highly scalable full serial interface. More recent versions of PCIe utilize advances in point-to-point interconnects, switch-based technology, and packetized protocols to provide new performance levels and features. Power management, Quality Of Service (QOS), Hot-Plug/Hot-Swap support, data integrity, error handling, and credit-based flow control belong to some among the advanced features supported by PCIe.

In past PCI technology, the transmitting device did not know the status of the reception buffer of the receiving device, and if the transaction was aborted due to the reception buffer being full, the transaction may be retransmitted until it was completed. As a result, the specific device may occupy the system bus for a long period of time, thereby causing serious degradation of system performance.

Afterwards, PCIe technology improved efficiency by preventing unnecessary communication by checking the buffer capacity of the receiving port before sending a transaction packet. At this time, end point devices such as host devices and storage devices may use a credit-based control mechanism. That is, during system initialization, each receiving port transfers the entire reception buffer size of that port to the sending port, and thereafter, the receiving port periodically transfers the remaining size of the reception buffer (the number of credits) to the sending port to occupy the reception buffer, to share information about condition of the reception buffer.

If the allocated size of the reception buffer is insufficient, the transmitting device (e.g., a storage device) may not be able to send transaction packets, and transmission will be delayed while waiting for flow control credit update information from the receiving device (e.g., the host device). This causes the degradation of the performance of the storage device and the entire system.

As the speed of interconnect architectures such as PCIe increases in the future, it is expected that performance degradation of endpoint devices such as storage devices will further worsen due to constraints on the size of the reception buffer of the host device. Example embodiments may improve the error correction capability inside the endpoint device and reduce the frequency of retransmission requests, thereby improving performance degradation of the endpoint device.

Figure 11:
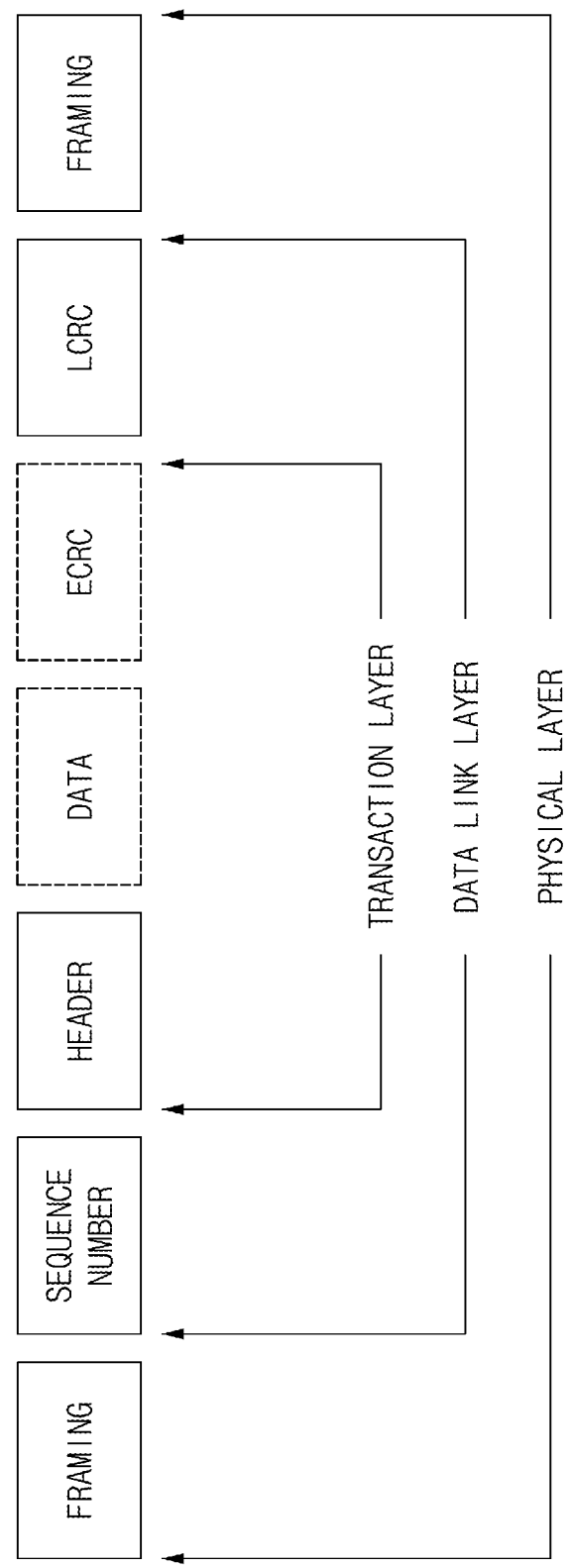

FIGS. 10 and 11 are diagrams illustrating an example of an interconnect architecture applied to a system according to some embodiments.

Referring to FIGS. 10 and 11, an embodiment of a layered protocol stack is illustrated. A layered protocol stack may include any form of a layered communication stack, such as a Quick Path Interconnect (QPI) stack, a PCIe stack, a next generation high performance computing interconnect stack, or other layered stack. Although the present disclosure explains the inventive concepts in relation to a PCIe stack, the same concepts may be applied to other interconnect stacks. In some embodiments, the protocol stack may be a PCIe protocol stack including a transaction layer, a data link layer, and a physical layer. An interface, such as the interfaces 317, 318, 321, 322, 326, and 331, may be represented as a communication protocol stack. Representation as a communication protocol stack may also be referred to as a module or interface implementing/including a protocol stack.

The PCI Express protocol uses packets to communicate information between components. The packets are formed in the transaction layer and the data link layer to carry the information from the transmitting component to the receiving component. As the transmitted packets flow through the other layers, they may be extended with additional information used to handle packets at those layers. At the receiving side the reverse process occurs, and packets may be transformed from their physical layer representation to the data link layer representation and finally (for transaction layer packets) to the form that may be processed by the transaction layer of the receiving device.

In some embodiments, the transaction layer may be used to provide an interface between a processing core of a device and the interconnect architecture, such as the data link layer and the physical layer. In this regard, a primary responsibility of the transaction layer may include the assembly and disassembly of packets (i.e., the transaction layer packets, or TLPs). The transaction layer typically manages credit-based flow control for TLPs. The PCIe implements split transactions, which may be transactions with a request and response separated by time, and may allow a link to carry other traffic while the target device gathers data for the response.

In addition the PCIe protocol may utilize credit-based flow control. In this scheme, a device advertises an initial amount of credit for each of the reception buffers in the transaction layer. An external device at the opposite end of the link may count the number of credits consumed by each TLP. A transaction may be transmitted if the transaction does not exceed a credit limit. Upon receiving a response, an amount of credit is restored. An advantage of a credit scheme is that the latency of credit return does not affect performance, provided that the credit limit is not encountered.

In some embodiments, the transaction layer may assemble packet header/payload. The payload may include data and an error detection code, e.g., ECRC. Formats for current packet headers/payloads may be found in the PCIe specification, which may be available at the PCIe specification website or other resource.

The link layer, also referred to as the data link layer, may act as an intermediate stage between the transaction layer and the physical layer or the PHY layer. In some embodiments, a responsibility of the data link layer may be to provide a reliable mechanism for exchanging the transaction layer packets (TLPs) between two components through a link. One side of the data link layer may accept TLPs assembled by the transaction layer, may apply a packet sequence identifier, e.g., a sequence number, an identification number or a packet number, may calculate and apply an error detection code, e,g., a LCRC, and may submit the modified TLPs to the physical layer for transmission across a physical layer to an external device.

In some embodiments, the physical layer includes a logical sub block and an electrical sub block to transmit physically a packet to an external device. Here, the logical sub block may be responsible for the "digital" functions of the physical layer. In this regard, the logical sub block may include a transmitter section configured to prepare outgoing information for transmission by the physical sub block, and a receiver section configured to identify and prepare received information before passing it to the link layer.

The physical block may include a transmitter TX and a receiver RX. The transmitter TX may be supplied by the logical sub block with symbols, which the transmitter may serialize and transmit to an external device. The receiver RX may be supplied with serialized symbols from an external device and may transform the received signals into a bit-stream. The bit-stream may be de-serialized and supplied to the logical sub block. In some embodiments, an 8b/10b transmission code may be employed, where ten-bit symbols are transmitted/received. Here, special symbols may be used to frame a packet with frames. In addition, in some embodiments, the receiver RX may also provide a symbol clock recovered from the incoming serial stream.

As described above, although the transaction layer, the link layer, and physical layer are discussed in reference to a specific implementation or embodiment of a PCIe protocol stack, the present disclosure is not so limited. In some embodiments, any layered protocol may be included/implemented.

Figure 12:
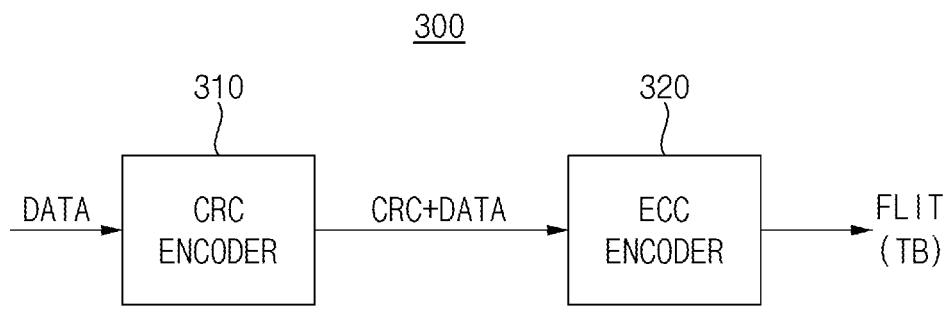
FIG. 12 is a block diagram illustrating an encoding circuit included in an electronic device according to some embodiments.

FIG. 12 is a block diagram illustrating an encoding circuit included in an electronic device according to some embodiments.

Referring to FIG. 12, a transmission circuit 300 may include a CRC encoder 310 and an ECC encoder 320. The CRC encoder 310 may CRC-encode the data and add the CRC to the data. The ECC encoder 320 may ECC-encode the CRC-added data and may add an ECC to generate a flit. The flit may then be converted into an analog signal RS corresponding to the PAM4 signal by a transmission circuit and nay be transmitted to a receiving device through a link. In one embodiment, the flit may be a flow control unit according to the PCIe standard.

Figure 13:
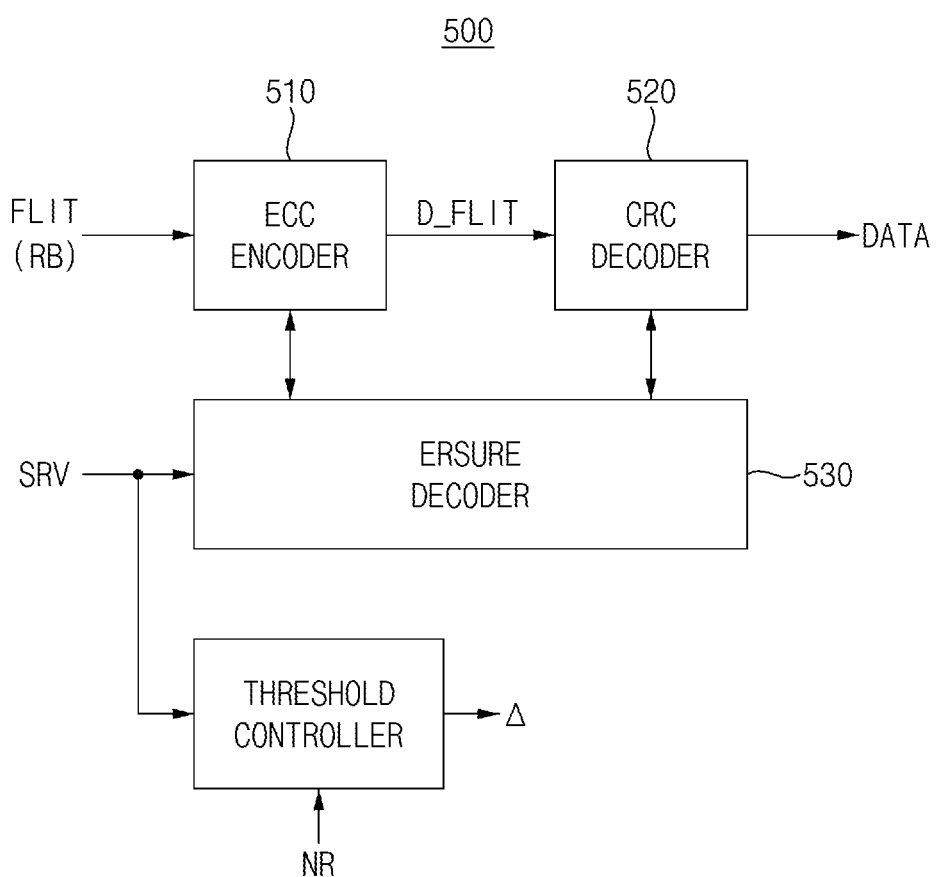
FIG. 13 is a block diagram illustrating a decoding circuit included in an electronic device according to some embodiments.

FIG. 13 is a block diagram illustrating a decoding circuit included in an electronic device according to some embodiments.

Referring to FIG. 13, a decoding circuit 500 may include an ECC decoder 510, a CRC decoder 520, and an erasure decoder 530. Depending on embodiment or implementation details, the decoding circuit 500 may further include a threshold value controller 540.

The ECC decoder 510 may ECC decode a flit (e.g., according to the PCIe standard), with the flit including a plurality of ECC symbols for each ECC group. Each ECC symbol may include a certain number of reception data bits RB, and the flit may include a certain number of ECC symbols.

The CRC decoder 520 may obtain data by CRC (Cyclical Redundancy Check) decoding the decoded flit (D_FLIT).

When CRC decoding fails, the erasure decoder 530 may be configured to extract an error symbol candidate from a plurality of ECC symbols based on a plurality of symbol reliability values SRV provided from the above-described alignment circuit, and may be configured to replace the error symbol candidate with a symbol generated based on the plurality of symbol reliability values SRV. After processing, ECC decoding may be performed again.

The ECC decoder 510 may be configured to ECC decode a flit containing the plurality of ECC symbols for each ECC group. For example, the ECC decoder 510 may use a Reed-Solomon (RS) signal that includes row parity and check bits generated by a parity check matrix (PCM) during ECC encoding in a transmitting device. ECC decoding may be performed based on the Reed-Solomon code. In other words, in some embodiments the aforementioned ECC symbol may be a Reed-Solomon symbol. When error correction for a plurality of ECC symbols fails, the decoding circuit 500 may be configured to perform RS erasure decoding by extracting an error symbol candidate from the plurality of ECC symbols based on the plurality of symbol reliability values.

PCM row parity and check bits may be generated by ECC encoding at the transmitting end. For example, PCM may be defined as follows.

$$H = \begin{vmatrix} 1 & 1 & \ldots & 1 & 0 & 1 \\ \alpha^{N-1} & \alpha^{N-2} & \ldots & \alpha & 1 & 0 \end{vmatrix} \begin{matrix} \text{Row Parity} \\ \text{Check Bits} \end{matrix}$$

Here, H is PCM, $\alpha$ is an element defined in GF (Galois field) 28 space, and N is the number of symbols in one ECC group. The rows of the PCM may be used to generate row parity and check bits, respectively.

Row parity may be defined as follows.

$$P = \sum_{i=0}^{83} B_i$$

Here, P may be low parity, and Bi is a symbol corresponding to TLP, DLP, and CRC among ECC symbols. That is, row parity may be generated through a bit-wise XOR operation of Bi symbols.

The check bit may be defined as follows.

$$C = \sum_{i=0}^{83} B_i \times \alpha^{(84-i)}$$

Here, C may be the check bit. That is, the check bit may be generated through a bit-wise XOR operation of Bi symbols multiplied by a, similar to CRC generation.

For example, the generation of row parity and check bits to be used when performing ECC encoding for an ECC group of 86B may be defined as follows.

$$\begin{bmatrix} 1 & 1 & 1 & \ldots & 1 & 1 & 1 \\ \alpha^{83} & \alpha^{82} & \alpha^{81} & \ldots & \alpha^2 & \alpha^1 & \alpha \end{bmatrix} B = \begin{bmatrix} P \\ C \end{bmatrix}$$

The transmitting end may be configured to perform ECC encoding based on the row parity and check bits and transmits the ECC encoded signal. The ECC decoder 510 may be configured to perform ECC decoding based on the RS code included in the ECC encoded signal, that is, the row parity and check bit, and may be configured to transmit the ECC decoded flit (D_FLIT) to the CRC decoder 520. The RS code may correct one error within one ECC group if the location of the error is not known, and up to two errors may be corrected if the location of the error is known.

The CRC decoder 520 may be configured to obtain data by CRC decoding the ECC decoded flit (D_FLIT). Here, the data may be TLP and DLP. The CRC decoder 520 may be configured to perform CRC decoding on the entire flit (or, more precisely, the remaining ECC symbols excluding the symbols corresponding to the ECC) regardless of the ECC group, based on the symbols corresponding to the CRC included in the flit.

If CRC decoding fails, the CRC decoder 520 may be configured to re-perform CRC decoding after ECC decoding is re-performed by the erasure decoder 530. If re-performance of CRC decoding fails, the CRC decoder 520 may request a retransmission (Retry) of the flit from the transmitter.

The erasure decoder 530 may be configured to perform erasure decoding when CRC decoding by the CRC decoder 520 fails. Eraser decoding may be defined as re-performing selection of symbols with a high probability of error occurrence among ECC symbols included in flit based on symbol reliability values SRB, random extraction of at least two of the selected symbols, erasure thereof, and performing of ECC decoding. Here, erasure processing may indicate processing the codeword of the corresponding symbol to 0.

According to some embodiments, when flits are interleaved for three ECC groups and errors occur in two symbols for at least one ECC group, if the CRC decoder 520 fails CRC decoding, erasure decoding may be performed.

As will be described below with reference to FIG. 23, the alignment circuit may be configured to determine the bit reliability values corresponding to each ECC symbol when at least one of the bit reliability values corresponding to each ECC symbol has a first value (e.g., '1'). Each symbol reliability value may be set to a third value (e.g., '1') indicating that each ECC symbol is an error symbol candidate with a high probability of error occurrence. Meanwhile, when the bit reliability values corresponding to each ECC symbol all have a second value (e.g., '0'), the alignment circuit may assign each symbol reliability value corresponding to each ECC symbol to a fourth value (e.g., '0') indicating that the symbol is a symbol with a low probability of error occurrence.

The threshold controller 540 may be configured adjust the plurality of soft decision reference values representing a plurality of error decision ranges based on the number of error symbol candidates corresponding to the third value obtained in this way. In other words, the threshold controller 540 may adjust the threshold value Δ described with reference to FIG. 3C based on the number of error symbol candidates.

As a result, the reception circuit may be configured to adjust the plurality of soft decision reference values such that each error decision range is reduced when the number of error symbol candidates corresponding to the third value is greater than the reference number. If the number of error symbol candidates is less than the reference number, the plurality of soft decision reference values may be adjusted such that each error decision range increases. In this way, the number of error symbol candidates for error correction may be appropriately adjusted.

FIG. 14 is a diagram for describing a flit mode supported by a logical sub block, and FIG. 15 is a diagram illustrating an error correction code (ECC) symbol for each lane.

Referring to FIG. 14, a flit may be a data unit supported in the flit mode of a standard (e.g., the PCIe standard) and in some embodiments may include TLP, DLP, CRC, and ECC. For example, a flit may have a size of 256B (Bytes), that is, 2048 bits, and for example may include 236B of TLP, 6B of DLP, 8B of CRC, and 6B of ECC. A flit may be interleaved for multiple lanes using a byte alignment method. For example, a flit may be interleaved in a 3-way manner. The interleaved flit may include a plurality of ECC symbols (or ECC codewords), and the plurality of ECC symbols may belong to one of a plurality of ECC groups. For example, when interleaved in a 3-way manner, there may be three ECC groups. Each of the plurality of ECC symbols may have a size of 8-bit. The ECC code belonging to each ECC group may correct errors occurring in each ECC group. When the flit size is 256B and the flit is interleaved in a 3-way manner, one of the plurality of ECC groups may include 86B of ECC symbols, and the remaining ECC groups may each include 85B of ECC symbols.

As shown, ECC symbols may be classified into symbols corresponding to TLP, symbols corresponding to DLP, symbols corresponding to CRC, and symbols corresponding to ECC. Here, the symbol corresponding to ECC may be a symbol that includes RS code information in the ECC symbol generated as a result of ECC encoding. In the case of symbols corresponding to CRC, one ECC group may include three symbols, and the remaining ECC group may include two symbols.

Referring to FIG. 15, interleaved ECC symbols may be arranged for each lane. Since PAM4 signaling may be applied in a flit mode, each ECC symbol may include a plurality of PAM4 symbols for PAM4 signaling. Accordingly, a flit may be understood as including a plurality of PAM4 symbols. PAM4 symbols may be placed on every 2-bit aligned boundary, and each PAM4 symbol may have a size of 2 bits. For example, as shown, if the ECC symbol has an 8-bit size, each ECC symbol may include 4 PAM4 symbols.

Hereinafter, some embodiments of the electronic device 100 having improved correction capabilities for errors occurring in the above-described flit will be described. The electronic device may be referred to as a PCIe device or a receiving device, and may correspond to the physical layer included in the PCIe layer.

FIGS. 16A, 16B and 16C are diagrams for describing erasure decoding according to some embodiments.

Referring to FIG. 16A, according to some embodiments, when an error occurs in two symbols in one ECC group among a plurality of ECC groups, erasure decoding may be performed. If CRC decoding fails in the CRC decoder 520, the erasure decoder 530 may be configured to extract error symbol candidates corresponding to a preset number of candidates (numErasure) (3 in the case of FIG. 16A) among ECC symbols. Error symbol candidates may be extracted to include symbols where actual errors have occurred. For example, in FIG. 16A, if an error actually occurs in candidate 1 (Cand1) and candidate 2 (Cand2), the erasure decoder 530 detects an error among candidate 1 (Cand1) and candidate 2 (Cand2) and the remaining symbols. Candidate 3 (Cand3), a symbol with high probability, may be extracted as an error symbol candidate. Candidate 1 (Cand1) to Candidate 3 (Cand3) have indices corresponding to 45, 48, and 51, respectively. The erasure decoder 530 randomly extracts two candidates from candidate 1 (Cand1) to candidate 3 (Cand3) and performs erasure processing and ECC decoding.

Erasure processing may include making the codeword value of the symbol corresponding to each index to 0. For example, if candidate 1 (Cand1) and candidate 3 (Cand3) are extracted from among candidates 1 (Cand1) and 3 (Cand3) in the first attempt, the erasure decoder 530 extracts the codeword value of the candidate, sets it to 0 and re-performs ECC decoding. The first attempt fails because the symbols that actually caused the error are candidate 1 (Cand1) and candidate 2 (Cand2).

If candidate 1 (Cand1) and candidate 2 (Cand2) are extracted in the second attempt, the erasure decoder 530 sets the codeword value of the candidate to 0 and then re-performs ECC decoding.

Since the candidate with the actual error has been extracted, ECC decoding is successful and erasure decoding may be terminated.

Referring to FIG. 16B, according to some embodiments, when errors occur in two symbols in two ECC groups among a plurality of ECC groups, erasure decoding may be performed. If CRC decoding fails in the CRC decoder 520, the erasure decoder 530 may be configured to extract error symbol candidates corresponding to a preset number of candidates (numErasure) (6 in the case of FIG. 16B) among ECC symbols. Error symbol candidates may be extracted to include symbols where actual errors have occurred. For example, in FIG. 16B, if an error actually occurs in candidate 1 (Cand1) to candidate 4 (Cand4), the erasure decoder 530 detects an error among candidate 1 (Cand1) to candidate 4 (Cand4) and the remaining symbols. Candidate 5 (Cand5) and candidate 6 (Cand6), symbols with high probability, may be extracted as error symbol candidates. Candidate 1 (Cand1) to Candidate 6 (Cand6) have indices corresponding to 41, 44, 45, 48, 50, and 51, respectively. The erasure decoder 530 may be configured to randomly extract four candidates from candidate 1 (Cand1) to candidate 6 (Cand6) and perform erasure processing and ECC decoding. For example, if candidate 1 (Cand1) to candidate 3 (Cand3) and candidate 5 (Cand5) are extracted from candidate 1 (Cand1) to candidate 6 (Cand6) in the first attempt, After setting the candidate's codeword value to 0, the erasure decoder 530 may perform ECC decoding again, and the first attempt may fail. If candidates 1 (Cand1) to 4 (Cand4) are extracted in the second attempt, the erasure decoder 530 may set the codeword value of the candidate to 0 and then re-performs ECC decoding. Since the candidate with the actual error has been extracted, ECC decoding is successful and erasure decoding may be terminated.

Referring to FIG. 16C, according to some embodiments, when errors occur in two symbols in each of three ECC groups among a plurality of ECC groups, erasure decoding may be performed. If CRC decoding fails in the CRC decoder 520, the erasure decoder 530 may be configured to extract error symbol candidates corresponding to a preset number of candidates (numErasure) (8 in the case of FIG. 16C) among ECC symbols. Error symbol candidates may be extracted to include symbols where actual errors have occurred. For example, in FIG. 6C, if an error actually occurs in candidate 1 (Cand1) to candidate 6 (Cand6), the erasure decoder 530 may detect an error among candidate 1 (Cand1) to candidate 6 (Cand6) and the remaining symbols. Candidate 7 (Cand7) and candidate 8 (Cand8), which are symbols with high probability, may be extracted as error symbol candidates. Candidate 1 (Cand1) to Candidate 8 (Cand8) may have indices corresponding to 41, 43, 44, 45, 46, 48, 50, and 51, respectively.

The erasure decoder 530 may be configured to randomly extract six candidates from candidate 1 (Cand1) to candidate 8 (Cand8) and performs erasure processing and ECC decoding. For example, if candidate 1 (Cand1) to candidate 5 (Cand5) and candidate 7 (Cand7) are extracted from candidates 1 (Cand1) to 8 (Cand8) in the first attempt, After setting the candidate's codeword value to 0, the erasure decoder 530 may perform ECC decoding again, and the first attempt may fail. If candidates 1 (Cand1) to 6 (Cand6) are extracted in the second attempt, the erasure decoder 530 may set the codeword value of the candidate to 0 and then re-perform ECC decoding. Since the candidate with the actual error has been extracted, ECC decoding is successful and erasure decoding may be terminated.

Figure 17:
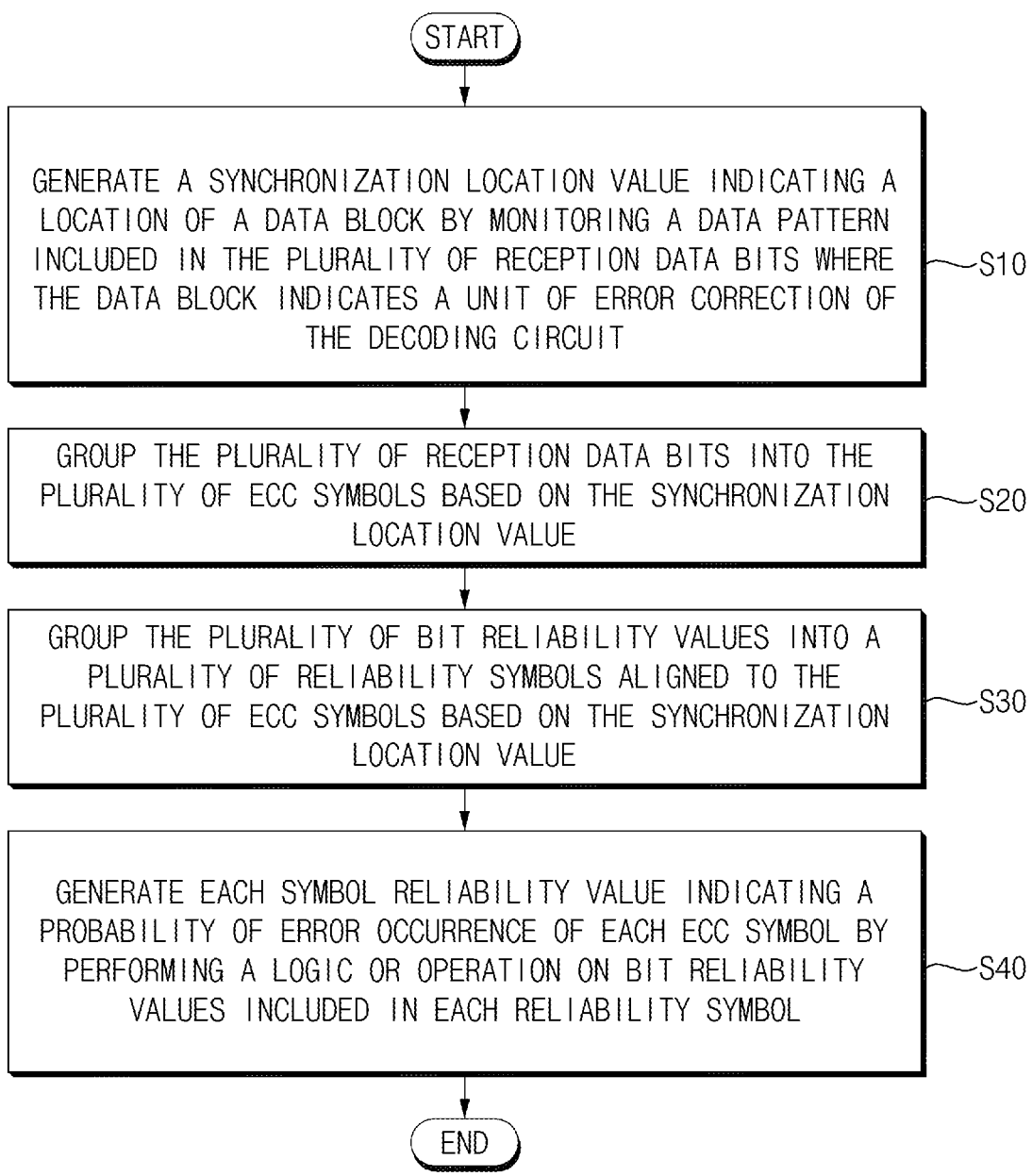
FIG. 17 is a flowchart illustrating an example embodiment of a method of aligning ECC symbols and symbol reliability values in an electronic device according to some embodiments.

FIG. 17 is a flowchart illustrating an example embodiment of a method of aligning ECC symbols and symbol reliability values in an electronic device according to some embodiments.

Referring to FIGS. 1 and 17, the alignment circuit AL1 or AL2 of the receiving device may generate synchronization location value SYNC indicating the location of the data block by monitoring the data pattern included in the plurality of reception data bits RB where the data block indicates a unit of error correction of the decoding circuit DEC1 or DEC2 (S10). The alignment circuits AL1 and AL2 may group the plurality of reception data bits RB into the plurality of ECC symbols ESM based on the synchronization position value SYNC (S20).

In addition, the alignment circuit AL1 or AL2 may, based on the synchronization location value SYNC, group the plurality of bit reliability values BRV into the plurality of reliability symbols (RSM in FIG. 18) aligned to the plurality of ECC symbols ESM, respectively (S30).

The plurality of bit reliability values BRV and/or a plurality of reliability symbols (RSM in FIG. 18), respectively aligned to the plurality of ECC symbols ESM based on the synchronization position value SYNC may be grouped (S30). The alignment circuit AL1 or AL2 may generate each symbol reliability value SRV indicating the probability of error occurrence of each ECC symbol ESM by performing a logic OR operation on the bit reliability values included in each reliability symbol (RSM) (S40).

Figures 18, 19:
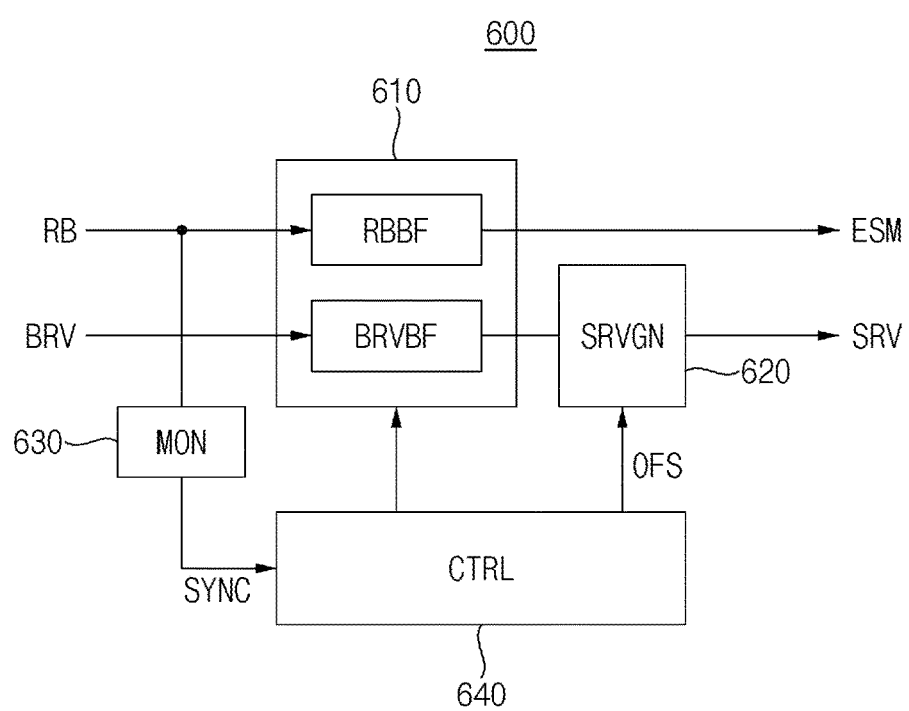
FIG. 18 is a diagram illustrating an example of ECC symbols and symbol reliability values that are aligned by the method of FIG. 17.
FIG. 19 is a block diagram illustrating an example embodiment of an alignment circuit included in an electronic device according to some embodiments.

FIG. 18 is a diagram illustrating an example of ECC symbols and symbol reliability values that are aligned by the method of FIG. 17.

FIG. 18 shows the ECC symbols ESM0 and ESM1, reliability symbols RSM0 and RSM1, and symbol reliability values SRV aligned by the alignment circuits AL1 and AL2. In FIG. 18, the unit interval UI may represent the time interval corresponding to one PAM3 symbol received by the receiving device.

Referring to FIG. 18, each of the ECC symbols ESM0 and ESM1 may include eight bits S0 to S7 included in the reception data bits. Each of the reliability symbols RSM0 and RSM1 may include four bits R0 to R3 included in the bit reliability values BRV. By performing logical operations on the bits R0 to R3 included in the reliability symbol RSM0 aligned to the ECC symbol ESM0, the symbol reliability value (RSV=RV0), which represents the error occurrence probability of the ECC symbol ESM0, may be decided. In addition, by performing a logical operation on the bits R0 to R3 included in the reliability symbol RSM aligned to the ECC symbol ESM1, a symbol reliability value (RSV=RV1) indicating the probability of error occurrence in the ECC symbol ESM1 may be determined.

Hereinafter, with reference to FIGS. 19 to 23, the method of FIGS. 17 and 18 will be described in greater detail.

Figure 20:
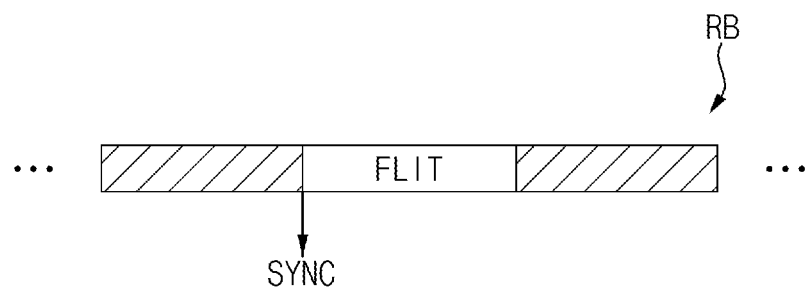
FIGS. 20, 21 and 22 are diagrams for describing example embodiments of a method of aligning ECC symbols and symbol reliability values in an electronic device according to some embodiments.
Figure 21:
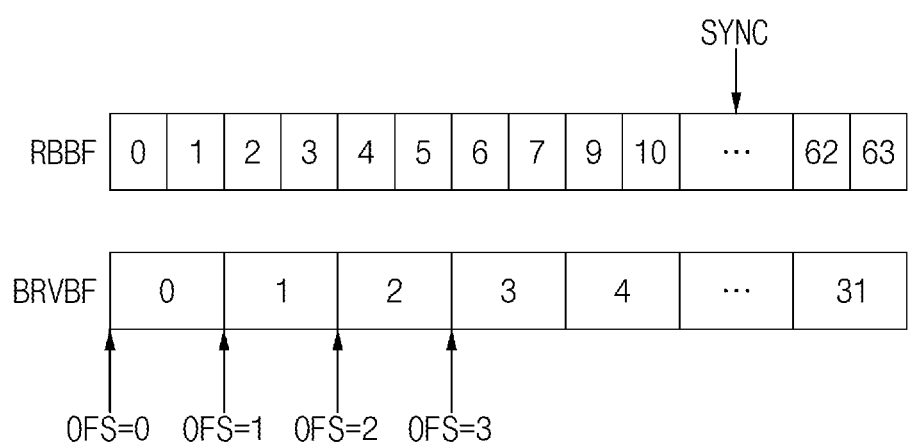
Figure 22:
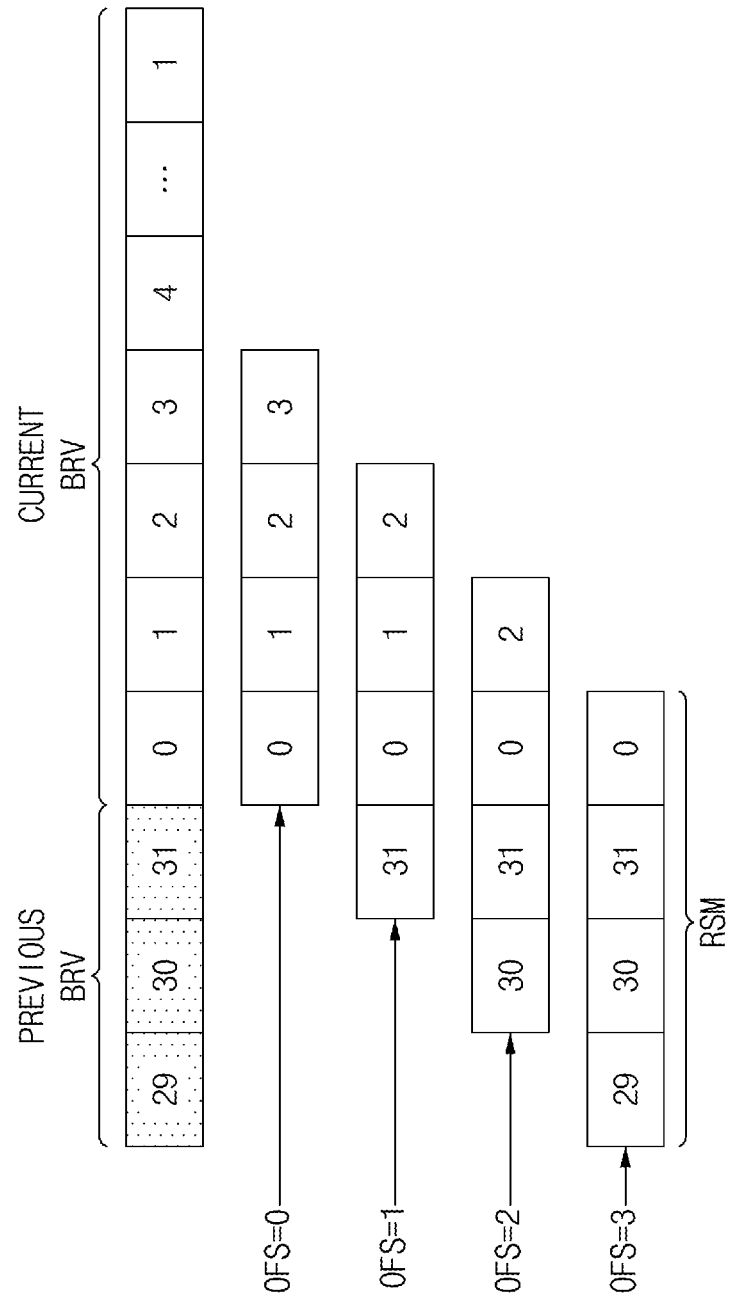

FIG. 19 is a block diagram illustrating an example of an alignment circuit included in an electronic device according to some embodiments, and FIGS. 20, 21 and 22 are diagrams for describing examples of methods of aligning ECC symbols and symbol reliability values in an electronic device according to some embodiments.

Referring to FIG. 19, the alignment circuit 600 may include a buffer unit 610, a symbol reliability value generator (SRVGN) 620, a monitor (MON) 630, and a control unit (CTRL) 640.

The buffer unit 610 may include a data buffer (RBBF) configured to store reception data bits RB and a reliability buffer BRVBF configured to store bit reliability values BRV. The data buffer RBBF and reliability buffer BRVBF may store reception data bits RB and reliability values BRV in reception units of a certain number of bits, respectively. For example, as shown in FIG. 21, the data buffer RBBF may store reception data bits RB in reception units of 64 bits, and the reliability buffer BRVBF may store reliability values BRV in reception units of 32 bits. The buffer unit 610 may be provided with two or more storage means or devices as shown in FIG. 21 to store not only the current reception unit but also the previous reception unit.

The monitor 630 may monitor the data pattern included in the plurality of reception data bits RB and may generate a synchronization position value SYNC indicating the location of a data block that is a unit for error correction of the decoding circuit. In some embodiments, the monitor 630 may be a unit for error correction of the decoding circuit by monitoring a data pattern corresponding to the Electrical Idle Exit Ordered Set (EIEOS) according to the PCIe standard included in a plurality of reception data bits RB. The synchronization position value SYNC that indicates the position of the data block may be generated. The synchronization position value SYNC may correspond to the start position of the flit as shown in FIG. 20, and may be expressed as the position value of the data buffer RBBF as shown in FIG. 21.

The control unit 640 may calculate the offset value OFS based on the synchronization position value SYNC. As shown in FIG. 18, the reception circuit may generate a bit reliability value BRV of one bit for each two reception data bits RB corresponding to each PAM4 symbol. When each ECC symbol ESM is 8 bits, the control unit 640 may obtain the remainder of dividing the synchronization position value SYNC by 8, may divide the remainder by 2, and may calculate the offset value OFS. Accordingly, as shown in FIG. 21, the offset value OFS may have a value of 0, 1, 2, or 3. The offset value OFS may indicate the starting position of the ESS symbol ESM in the data buffer RBBF and the starting position of the aforementioned reliability symbol RSM in the reliability buffer BRVBF.

The control unit 640 may group the reception data bits RB stored in the data buffer RBBF into ECC symbols ESM based on the offset value OFS and output them. In addition, the control unit 640 may group the bit reliability values BRV stored in the reliability buffer BRVBF into reliability symbols RSM respectively aligned to ECC symbols ESM based on the offset value OFS. The symbol reliability value generator 620 may receive the bit reliability values BRV grouped into reliability symbols RSM and may generate a symbol reliability value SRV corresponding to each ECC symbol ESM.

Figure 23:
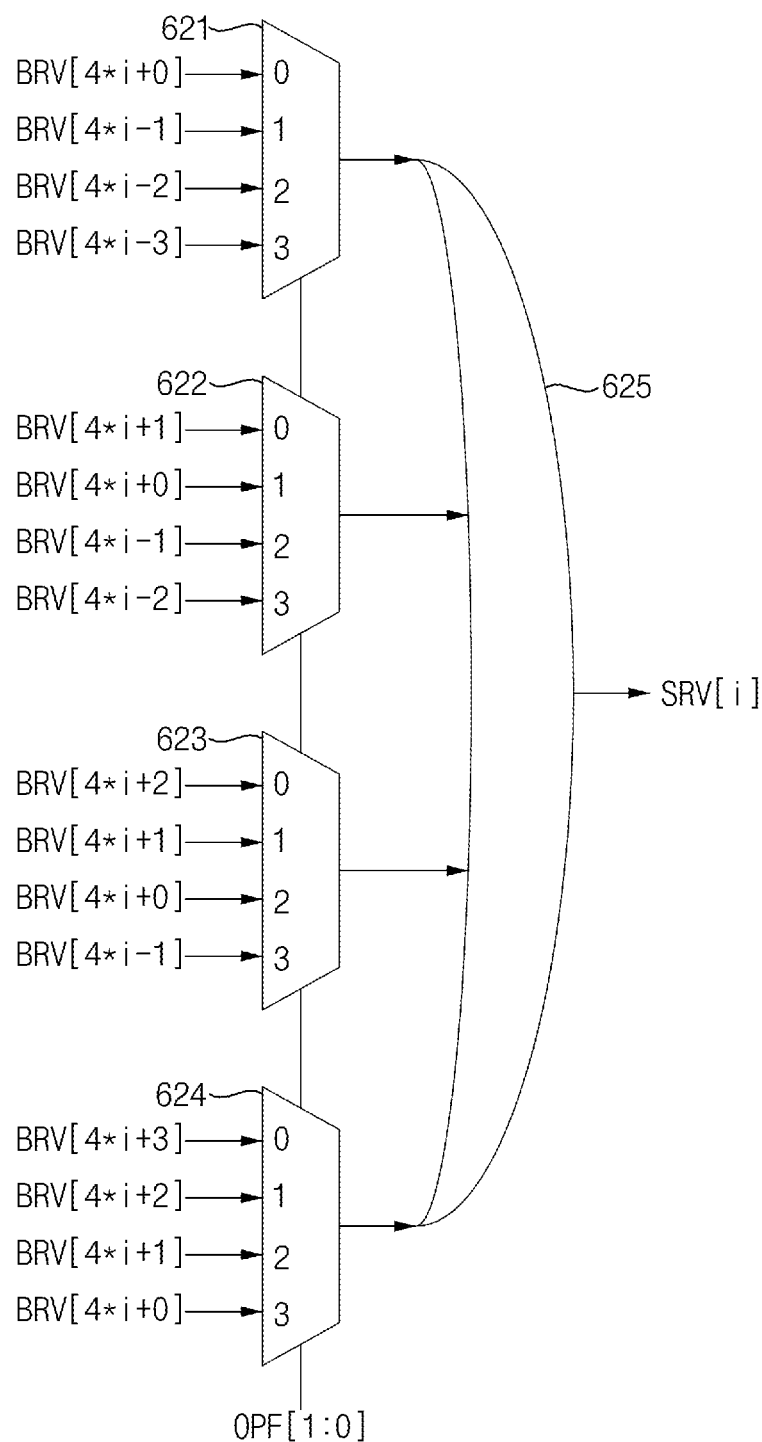
FIG. 23 is a diagram illustrating an example embodiment of a symbol reliability generator included in the alignment circuit of FIG. 19.

FIG. 23 is a diagram illustrating an example embodiment of a symbol reliability generator included in the alignment circuit of FIG. 19.

Referring to FIG. 23, the symbol reliability value generator 620 may include a first multiplexer 621, a second multiplexer 622, a third multiplexer 623, a fourth multiplexer 624, and an OR gate 625. In FIG. 23, i corresponds to integers from 0 to 7. BRV [x] represents the previous bit reliability values (PREVIOUS BRV) of FIG. 22 if x is a negative integer, and indicates the current bit reliability values (CURRENT BRV) if x is 0 or a positive integer. As shown in FIG. 23, when i=0, some inputs of the multiplexer may correspond to previous bit reliability values (PREVIOUS BRV).

The first multiplexer 621 may select and output one of four bit reliability values BRV[4*i+0], BRV [4*i−1], BRV [4*i−2 and BRV [4*i−3] based on the offset value OFS [1:0]. 2] The second multiplexer 622 may select and output one of four bit reliability values BRV [4*i+1], BRV [4*i+0], BRV [4*i−1] and BRV [4*i−2] based on the offset value OFS [1:0]. The third multiplexer 623 may select and output one of four bit reliability values (BRV [4*i+2], BRV [4*i+1], BRV [4*i+0] and BRV [4*i−1] based on the offset value OFS [1:0]. The fourth multiplexer 624 may select and output one of four bit reliability values BRV [4*i+3], BRV [4*i+2], BRV [4*i+1] and BRV [4*i+0]) based on the offset value OFS [1:0].

The OR gate 625 may perform an OR operation on the four bit reliability values output from the first multiplexer 621, the second multiplexer 622, the third multiplexer 623, and the fourth multiplexer 624 to generate the symbol reliability value SRV [i] corresponding to the i-th ECC symbol ESMi.

As a result, as shown in FIG. 22, when the offset value OFS is 0, the current bit reliability values (CURRENT BRV) corresponding to positions 0 to 3 become the input of the OR operation. When the offset value OFS is 1, the previous bit reliability value (PREVIOUS BRV) corresponding to position 31 and the current bit reliability values (CURRENT BRV) corresponding to positions 0 to 2 become the input of the OR operation. When the offset value OFS is 2, the previous bit reliability values (PREVIOUS BRV) corresponding to positions 30 to 31 and the current bit reliability values (CURRENT BRV) corresponding to positions 0 to 1 become the input of the OR operation. When the offset value OFS is 3, the previous bit reliability values (PREVIOUS BRV) corresponding to positions 29 to 31 and the current bit reliability value (CURRENT BRV) corresponding to position 0 become the input of the OR operation.

In this way, the offset value OFS may be calculated based on the synchronization position value SYNC, and the reception data bits RB and bit reliability values BRV may be grouped based on the offset value OFS.

Figure 24:
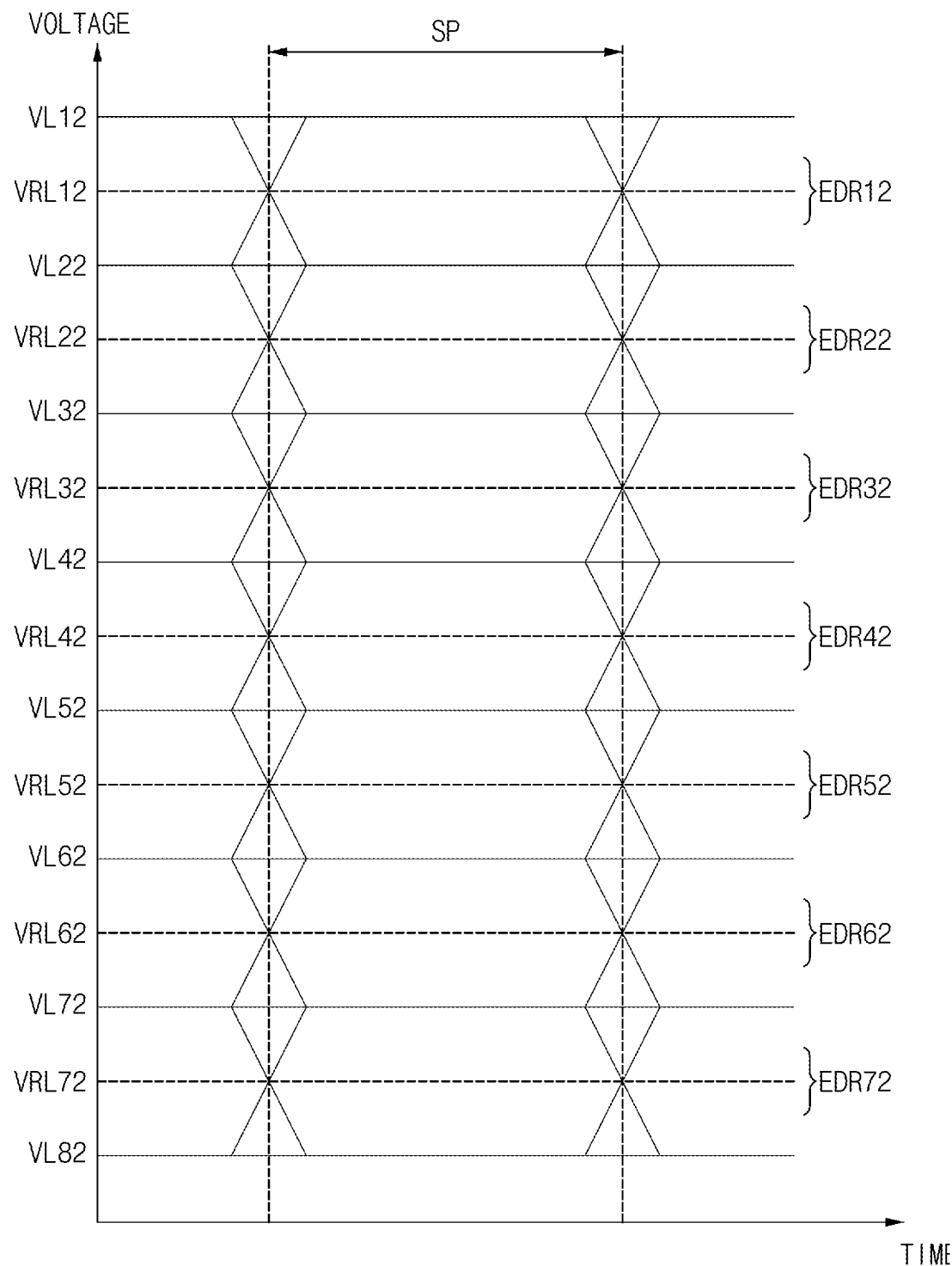
FIG. 24 is a diagram illustrating a PAM8 scheme in an electronic device according to some embodiments.

FIG. 24 is a diagram illustrating a PAM8 scheme in an electronic device according to some embodiments.

FIG. 24 illustrates first, second, third, fourth, fifth, sixth, seventh and eighth voltage levels VL12, VL22, VL32, VL42, VL52, VL62, VL72, and VL82 and first, second, third, fourth, fifth, sixth and seventh reference voltage levels VRL12, VRL22, VRL32, VRL42, VRL52, VRL62, and VRL72. The size relationship between voltage levels and reference voltage levels may be as shown. In this case, the voltage level of the analog signal RS may include information about three bits.

Similar to what was described with reference to FIG. 3C, a plurality of error determination ranges EDR12 to EDR72 for determining the bit reliability value may be set. As described above, a plurality of error determination ranges EDR12 to EDR72 may be determined by setting a plurality of upper soft decision reference values and a plurality of lower soft decision reference values.

Figure 25:
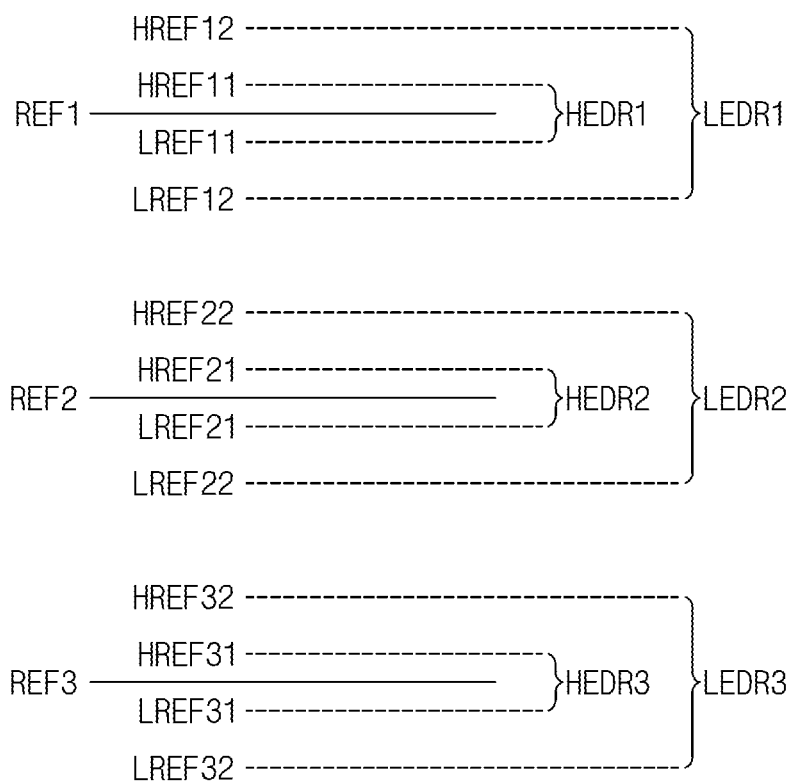
FIG. 25 is a diagram illustrating an example embodiment of a method of generating a bit reliability value in an electronic device according to some embodiments.
Figure 26:
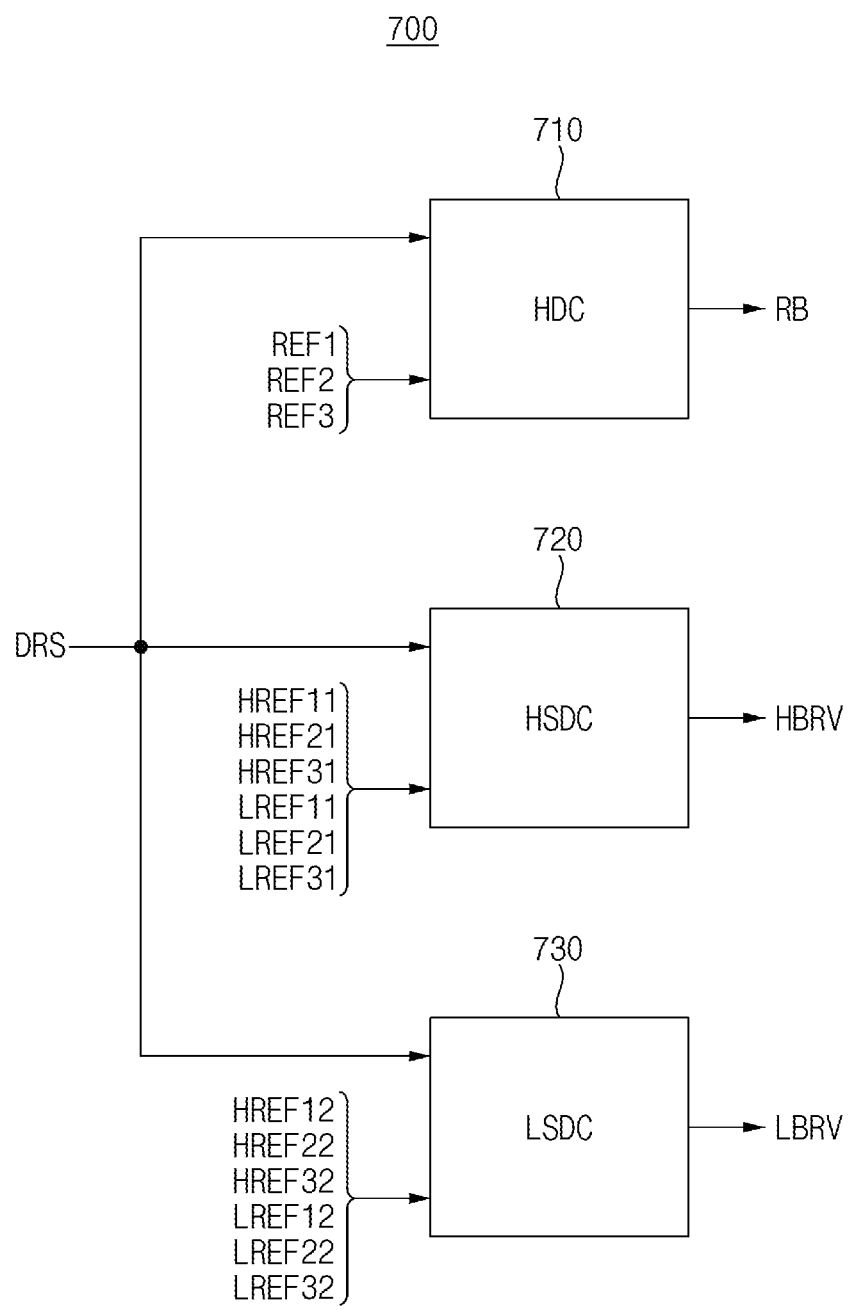
FIG. 26 is a block diagram illustrating an example of a reception circuit that performs the method of FIG. 25.

FIG. 25 is a diagram illustrating an example of a method of generating a bit reliability value in an electronic device according to some embodiments, and FIG. 26 is a block diagram illustrating an example of a reception circuit that performs the method of FIG. 25 according to some embodiments.

Referring to FIG. 25, a plurality of main error decision ranges HEDR1, HEDR2, and HEDR3) and a plurality of sub error decision ranges LEDR1, LEDR2, and LEDR3 centered on a plurality of hard decision reference values REF1, REF2, and REF3, respectively, may be set. Each of the plurality of sub error determination ranges LEDR1, LEDR2, and LEDR3 may be wider than each of the plurality of main error determination ranges HEDR1, HEDR2, and HEDR3, that is, to include the plurality of main error determination ranges HEDR1, HEDR2, and HEDR3.

A plurality of main error decision ranges HEDR1, HEDR2, and HEDR3 may be defined by a plurality of main soft decision reference values HREF11, LREF11, HREF21, LREF21, HREF31, and LREF31, and a plurality of sub error decision ranges LEDR1, LEDR2, and LEDR3 may be defined by a plurality of sub soft decision reference values HREF12, LREF12, HREF22, LREF22, HREF32, and LREF32.

Referring to FIG. 26, a reception circuit 700 may include a hard decision circuit HDC 710, a main soft decision circuit (HSDC) 720, and a sub soft decision circuit (LSDC) 730. In FIG. 26, the analog-to-digital converter that converts the voltage level of the analog signal RS to the reception digital value DRS is omitted.

The hard decision circuit 710 may be configured to generate a plurality of reception data bits RB by comparing the reception digital value DRS with a plurality of hard decision reference values REF1, REF2, and REF3, respectively.

The main soft decision circuit 720 may be configured to generate bit reliability values HBRV by comparing the reception digital value DRS with a plurality of main soft decision reference values HREF11, LREF11, HREF21, LREF21, HREF31, and LREF31 to determine a plurality of bit reliability values BRV among the plurality of bit reliability values BRV.

The sub soft decision circuit 730 may be configured to generate bit confidence values LBRV by comparing the reception digital value DRS with a plurality of sub soft decision reference values HREF12, LREF12, HREF22, LREF22, HREF32, and LREF32 to determine a plurality of sub among the plurality of bit reliability values BRV.

The main bit reliability value HBRV and sub bit reliability value LHRV represent different degrees of error occurrence probability for the corresponding reception data bit RB. The number of error symbol candidates may be appropriately adjusted using the main bit reliability value HBRV and sub bit reliability value LHRV. For example, when the number of error symbol candidates is greater than the reference number, only the reception data bits that belong to the main error decision range but do not belong to the sub error decision range are assigned a first value indicating a high probability of error occurrence (e.g., '1'), the number of error symbol candidates may be reduced.

Figure 27:
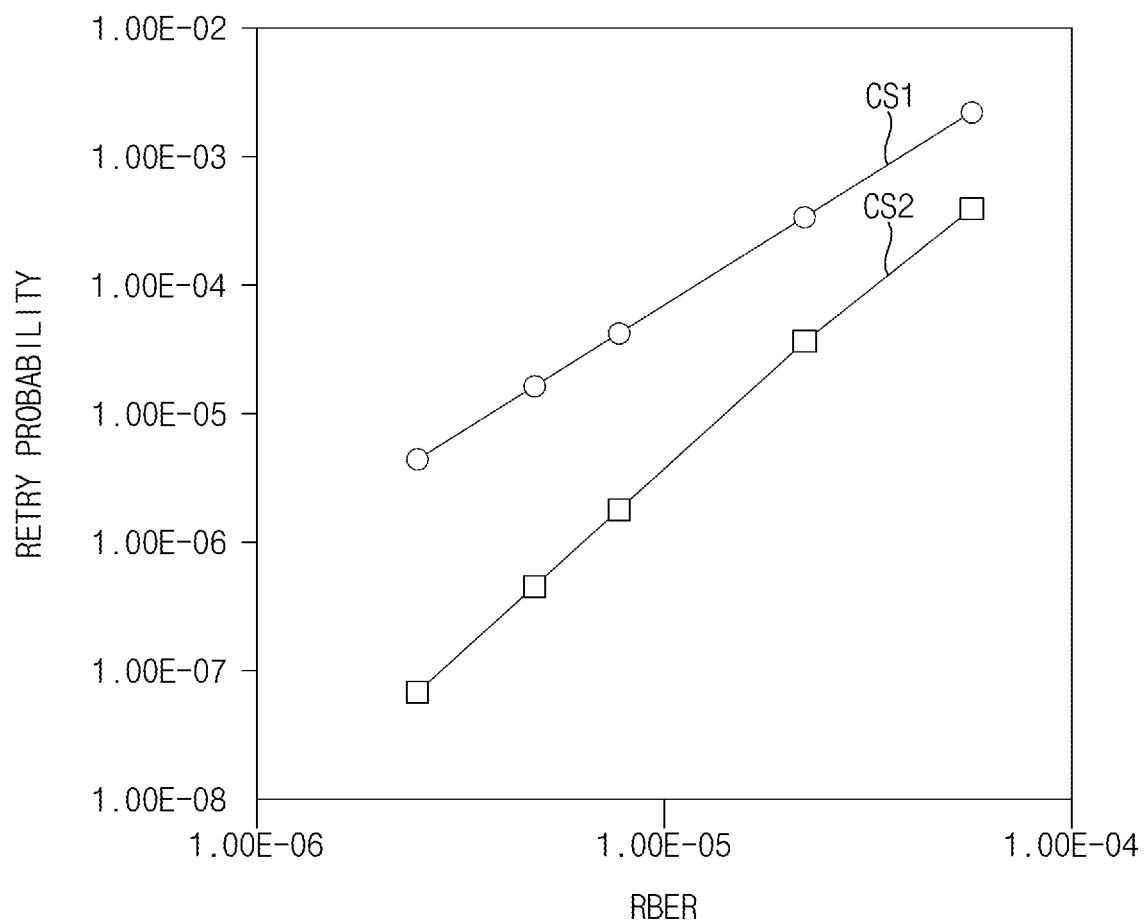
FIG. 27 is a diagram illustrating error correction performance of an electronic device according to some embodiments of the present inventive concepts.

FIG. 27 is a diagram illustrating error correction performance of an electronic device according to some embodiments of the present inventive concepts.

In FIG. 27, the horizontal axis represents RBER (Raw Bit Error Rate) and the vertical axis represents retransmission request probability (RETRY PROBABILITY). The first graph CS1 represents the probability of a retransmission request when error correction is performed according to the prior art, and the second graph CS2 represents the probability of a retransmission request when error correction is performed according to example embodiments.

When RBER is high, the probability of selecting an erroneous ECC symbol decreases, but as RBER becomes lower, the probability of selecting an erroneous ECC symbol may greatly increase. The retransmission request probability is the probability of checking the ECC symbol in which an error occurred in PCIe 6.0 for errors through CRC and requesting retransmission from the transmitting device. The lower the retransmission request probability, the lower the retransmission rate, which is advantageous for improving data transmission performance. If the position of a symbol with a high error probability is selected through the method according to example embodiments, the number of cases that may be corrected in the decoding circuit increases, thereby significantly improving the performance of the electronic device.

Figure 28:
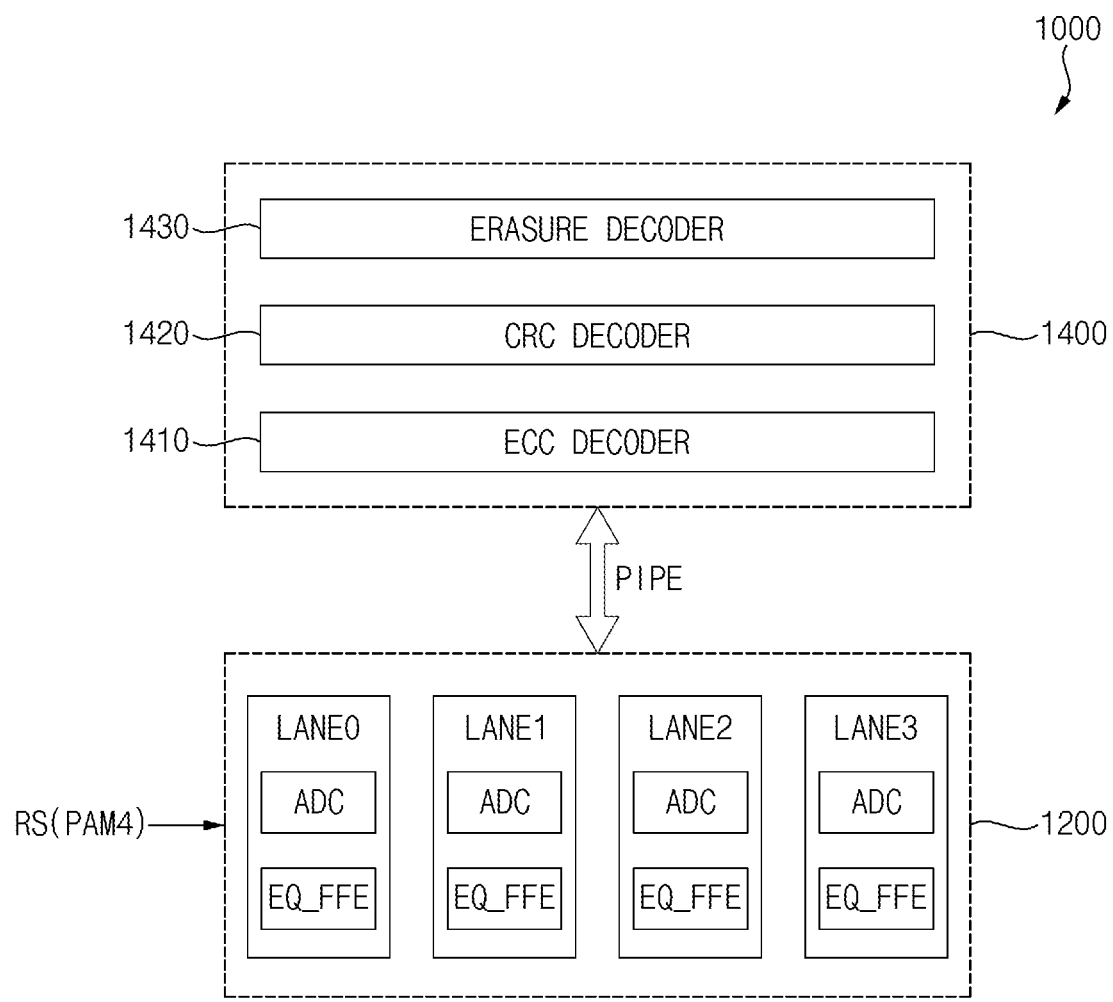
FIG. 28 is a diagram illustrating an electronic device according to example embodiments.

FIG. 28 is a diagram illustrating an electronic device according to some embodiments.

Referring to FIG. 28, a system 1000 may include an electrical sub block 1200 and a logical sub block 1400.

The electrical sub block 1200 according to some embodiments may include an analog-to-digital converter ADC and a feed forward equalizer EQ_FFE for each of the plurality of lanes LANE0 to LANE3. When the electrical sub block 1200 receives a 4-level PAM4 signal through a link, it may generate a conversion signal by performing the analog-digital conversion and equalization through the analog-to-digital converter ADC and a feedforward equalizer EQ_FFE for each of the plurality of lanes LANE0 to LANE3.

The electrical sub block 1200 may be connected to the logical sub block 1400 through a pipe (PIPE) and may be configured to transmit a conversion signal to the logical sub block 1400. In some embodiments, the PIPE may be configured to convert signals transmitted between the electrical sub block 1200 and the logical sub block 1400 through serialization or parallelization.

The logical sub block 1400 may include an ECC decoder 1410, a CRC decoder 1420, and an erasure decoder 1430. As described above with reference to FIG. 13, the ECC decoder 1410 may be configured to ECC decode the flit (FLIT), and the CRC decoder 1420 may be configured to obtain data by CRC decoding the ECC decoded flit (D_FLIT). If CRC decoding fails, the CRC decoder 1420 may be configured to notify the erasure decoder 1430 that CRC decoding has failed.

When the erasure decoder 1430 finds that CRC decoding has failed, the erasure decoder 1430 may be configured to extract an error symbol candidate based on symbol reliability values generated by a method according to some embodiments and perform erasure decoding. If erasure decoding is successful, the erasure decoder 1430 may transfer the decoded signal to the CRC decoder 1420, and the CRC decoder 1420 re-performs CRC decoding. If re-performance of CRC decoding fails, the CRC decoder 1420 may request that the transmitter to retransmit the flit.

As described above, the electronic device and method of operating the electronic device according to some embodiments may efficiently generate symbol reliability values for ECC symbols based on the voltage level of the analog signal received through the link. Error symbol candidates may be extracted and the error correction ability of electronic devices may be improved.

The inventive concepts provided herein may be applied to many different types of electronic devices and systems. For example, the inventive concepts provided herein may be applied to various systems, examples of which include a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive driving system, or the like.

The foregoing is illustrative of some embodiments and is not to be construed as limiting thereof. Although a few examples of embodiments have been described, those skilled in the art will readily appreciate that many modifications of the examples of embodiments described herein are possible without materially departing from the present inventive concepts.

The invention claimed is:

1. An electronic device comprising:
a reception circuit configured to generate a plurality of reception data bits based on a voltage level of an analog signal received through a link, and configured to generate a plurality of bit reliability values indicating probabilities of error occurrence of the plurality of reception data bits based on the voltage level of the analog signal;
an alignment circuit configured to group the plurality of reception data bits into a plurality of error correction code (ECC) symbols, and configured to generate a plurality of symbol reliability values indicating probabilities of error occurrence of the plurality of ECC symbols based on the plurality of bit reliability values; and
a decoding circuit configured to correct errors of the plurality of ECC symbols based on the plurality of symbol reliability values.

2. The electronic device of claim 1, wherein the reception circuit includes:
an analog-digital converter configured to convert the voltage level of the analog signal to a reception digital value;
a hard decision circuit configured to generate the plurality of reception data bits based on a comparison of the reception digital value with a plurality of hard decision reference values; and
a soft decision circuit configured to generate the plurality of bit reliability values based on a comparison of the reception digital value with a plurality of soft decision reference values indicating a plurality of error decision ranges where each error decision range is centered on each hard decision reference value.

3. The electronic device of claim 2, wherein the soft decision circuit is configured to determine each bit reliability value of the plurality of bit reliability values as a first value indicating a high probability of error occurrence when the reception digital value is included in the plurality of error decision ranges, and determine each bit reliability value of the plurality of bit reliability values as a second value indicating a low probability of error occurrence when the reception digital value is not included in the plurality of error decision ranges.

4. The electronic device of claim 3, wherein the alignment circuit is configured to determine each symbol reliability value corresponding to each ECC symbol as a third value indicating each ECC symbol being an error symbol candidate of a high probability of error occurrence when at least one of the plurality of bit reliability values corresponding to each ECC symbol has the first value, and determine each symbol reliability value corresponding to each ECC symbol as a fourth value indicating each ECC symbol being a symbol of a low probability of error occurrence when all of the plurality of bit reliability values corresponding to each ECC symbol have the second value.

5. The electronic device of claim 4, wherein the reception circuit is configured to adjust the plurality of soft decision reference values indicating the plurality of error decision ranges based on a number of error symbol candidates corresponding to the third value.

6. The electronic device of claim 5, wherein the reception circuit is configured to adjust the plurality of soft decision reference values such that each error decision range of the plurality of error decision ranges is decreased, when the number of the error symbol candidates corresponding to the third value is greater than a reference number, and wherein the reception circuit is configured adjust the plurality of soft decision reference values such that each error decision range of the plurality of error decision ranges is increased, when the number of the error symbol candidates corresponding to the third value is smaller than the reference number.

7. The electronic device of claim 2, wherein each error decision range of the plurality of error decision ranges corresponds to a range between an upper soft decision reference value and a lower soft decision reference value where the upper soft decision reference value is greater by a threshold value than each hard decision reference value and the lower soft decision reference value is smaller by the threshold value than each hard decision reference value.

8. The electronic device of claim 1, wherein the alignment circuit is configured to generate a synchronization location value indicating a location of a data block based on monitoring of a data pattern included in the plurality of reception data bits where the data block indicates a unit of error correction of the decoding circuit, wherein the alignment circuit is configured to group the plurality of reception data bits into the plurality of ECC symbols based on the synchronization location value, and wherein the alignment circuit is configured to group the plurality of bit reliability values into a plurality of reliability symbols aligned to the plurality of ECC symbols based on the synchronization location value.

9. The electronic device of claim 8, wherein the alignment circuit is configured to generate each symbol reliability value indicating a probability of error occurrence of each ECC symbol by performing a logic OR operation on bit reliability values included in each reliability symbol.

10. The electronic device of claim 1, wherein the reception circuit includes:
a hard decision circuit configured to generate the plurality of reception data bits based on a comparison of the voltage level of the analog signal with a plurality of hard decision reference voltages; and
a soft decision circuit configured to generate the plurality of bit reliability values based on a comparison of the voltage level of the analog signal with a plurality of soft decision reference voltages indicating a plurality of error decision ranges where each error decision range is centered on each hard decision reference voltage.

11. The electronic device of claim 1, wherein the reception circuit includes:
an analog-digital converter configured to convert the voltage level of the analog signal to a reception digital value;
a hard decision circuit configured to generate the plurality of reception data bits based on a comparison of the reception digital value with a plurality of hard decision reference values;
a main soft decision circuit configured to generate a plurality of main bit reliability values based on a comparison of the reception digital value with a plurality of main soft decision reference values indicating a plurality of main error decision ranges where each main error decision range is centered on each hard decision reference value; and a sub soft decision circuit configured to generate a plurality of sub bit reliability values based on a comparison of the reception digital value with a plurality of sub soft decision reference values indicating a plurality of sub error decision ranges where each sub error decision range is broader than each main error decision range.

12. The electronic device of claim 1, wherein the alignment circuit is configured to provide the plurality of ECC symbols and the plurality of symbol reliability values aligned to the plurality of ECC symbols to the decoding circuit regardless of failure of error correction of the decoding circuit.

13. The electronic device of claim 1, wherein the link conforms to a peripheral component interconnect express (PCIe) standard, and the analog signal is a pulse amplitude modulation-4 (PAM4) signal.

14. The electronic device of claim 13, wherein the plurality of ECC symbols are Read-Solomon (RS) symbols, and the decoding circuit is configured to, when error correction with respect to the plurality of ECC symbols fails, perform RS erasure decoding by extracting error symbol candidates among the plurality of ECC symbols based on the plurality of symbol reliability values.

15. The electronic device of claim 13, wherein the reception circuit is configured to generate a bit reliability value of one bit per two reception data bits, and wherein the alignment circuit is configured to generate a synchronization location value indicating a location of a data block by monitoring a data pattern included in the plurality of reception data bits where the data block indicates a unit of error correction of the decoding circuit and the data pattern corresponds to an Electrical Idle Exit Ordered Set according to the PCIe standard, and to group the plurality of reception data bits into the plurality of ECC symbols based on the synchronization location value.

16. The electronic device of claim 13, wherein the decoding circuit includes:

an ECC decoder configured to decode a flit including the plurality of ECC symbols by units of ECC groups where the flit is defined by the PCIe standards;

a cyclical redundancy check (CRC) decoder configured to perform CRC decoding with respect to an ECC decoded flit; and an erasure decoder configured to, when the CRC decoding fails, extract at least one error symbol candidate among the plurality of ECC symbols based on the plurality of symbol reliability values provided from the alignment circuit, and perform ECC decoding by erasure-processing the at least one error symbol candidate.

17. An electronic device comprising:

a reception circuit configured to generate a plurality of reception data bits based on a voltage level of a pulse amplitude modulation-4 (PAM4) signal received through a link, and generate a plurality of bit reliability values indicating probabilities of error occurrence of the plurality of reception data bits based on the voltage level of the PAM4 signal;

an alignment circuit configured to generate a synchronization location value indicating a location of a data block by monitoring a data pattern included in the plurality of reception data bits where the data block indicates a unit of error correction, group the plurality of reception data bits into a plurality of error correction code (ECC) symbols based on the synchronization location value, and generate a plurality of symbol reliability values based on the synchronization location value and the plurality of bit reliability values, where the plurality of symbol reliability values indicate probabilities of error occurrence of the plurality of ECC symbols and are aligned to the plurality of ECC symbols; and a decoding circuit configured to correct errors of the plurality of ECC symbols based on the plurality of symbol reliability values.

18. The electronic device of claim 17, wherein the alignment circuit is configured to group the plurality of bit reliability values into a plurality of reliability symbols aligned to the plurality of ECC symbols based on the synchronization location value, and to generate each symbol reliability value indicating a probability of error occurrence of each ECC symbol by performing a logic OR operation on bit reliability values included in each reliability symbol.

19. The electronic device of claim 18, wherein each ECC symbol corresponds to eight bits and each reliability symbol corresponds to four bits, and wherein the alignment circuit is configured to obtain a remainder by dividing the synchronization location value by eight, to generate an alignment value by dividing the remainder by two, and to determine a starting point of each reliability symbol based on the alignment value.

20. A method of operating an electronic device, comprising:

generating a plurality of reception data bits based on a voltage level of an analog signal received through a link;

generating a plurality of bit reliability values indicating probabilities of error occurrence of the plurality of reception data bits based on the voltage level of the analog signal;

grouping the plurality of reception data bits into a plurality of error correction code (ECC) symbols;

generating a plurality of symbol reliability values indicating probabilities of error occurrence of the plurality of ECC symbols based on the plurality of bit reliability values; and correcting errors of the plurality of ECC symbols based on the plurality of symbol reliability values.

* * * * *